(12) United States Patent
Lee

(10) Patent No.: US 8,373,489 B2
(45) Date of Patent: Feb. 12, 2013

(54) OFFSET CANCELLATION FOR SAMPLED-DATA CIRCUITS

(75) Inventor: Hae-Seung Lee, Bedford, MA (US)

(73) Assignee: Maxim Integrated Products, Inc., San Jose, CA (US)

( * ) Notice: Subject to any disclaimer, the term of this patent is extended or adjusted under 35 U.S.C. 154(b) by 205 days.

(21) Appl. No.: 12/909,168

(22) Filed: Oct. 21, 2010

(65) Prior Publication Data

US 2011/0032003 A1  Feb. 10, 2011

Related U.S. Application Data

(62) Division of application No. 11/686,739, filed on Mar. 15, 2007, now Pat. No. 7,843,233.

(60) Provisional application No. 60/743,601, filed on Mar. 21, 2006.

(51) Int. Cl.
*G06F 7/64* (2006.01)

(52) U.S. Cl. ............... 327/337; 327/78; 327/91; 327/95; 327/307

(58) Field of Classification Search .................... 327/77, 327/78, 91, 93–95, 307, 337
See application file for complete search history.

(56) References Cited

U.S. PATENT DOCUMENTS

| 3,649,924 | A | | 3/1972 | Lucas |
| 3,810,031 | A | | 5/1974 | Poujois |
| 4,439,693 | A | | 3/1984 | Lucas et al. |
| 4,553,052 | A | | 11/1985 | Takahashi |
| 5,159,341 | A | * | 10/1992 | McCartney et al. .......... 341/143 |
| 5,617,093 | A | | 4/1997 | Klein |
| 6,104,492 | A | | 8/2000 | Giles et al. |
| 6,201,489 | B1 | | 3/2001 | Castellucci et al. |
| 6,469,561 | B2 | * | 10/2002 | Pernigotti et al. ............ 327/336 |
| 6,611,163 | B1 | | 8/2003 | Mukherjee et al. |
| 7,221,191 | B2 | | 5/2007 | Ali et al. |
| 7,319,425 | B2 | | 1/2008 | Fiorenza et al. |
| 7,564,273 | B2 | * | 7/2009 | Guyton et al. .................. 327/91 |
| 7,843,233 | B2 | * | 11/2010 | Lee ................................. 327/94 |
| 2009/0267650 | A1 | * | 10/2009 | Lee ................................. 327/50 |

OTHER PUBLICATIONS

The European Search Report corresponding to the European Application No. 07758608.9 issued on Mar. 18, 2009.
The International Search Report and Written Opinion corresponding to PCT Application PCT/US07164071 mailed on Jul. 11, 2008.

* cited by examiner

*Primary Examiner* — Long Nguyen
(74) *Attorney, Agent, or Firm* — North Weber & Baugh LLP

(57) ABSTRACT

A comparator based circuit with effective offset cancellation includes first and second amplifiers and an offset capacitor operatively connected to the first and second amplifiers. An offset voltage source generates an offset voltage. A first switch connects the offset voltage source to ground during a first time period. The first amplifier generates an output voltage in response to the first switch connecting the offset voltage source to ground during the first time period. A second switch connects the offset capacitor to ground during a second time period. The first switch disconnects the offset voltage source from ground during a third time period, and the second switch disconnects the offset capacitor from ground during the third time period.

22 Claims, 25 Drawing Sheets

OFFSET CANCELLATION FOR SAMPLED-DATA CIRCUITS

PRIORITY INFORMATION

The present application is a divisional of U.S. Utility application Ser. No. 11/686,739, filed on Mar. 15, 2007, that claims priority to U.S. Provisional Application Ser. No. 60/743,601, filed on Mar. 21, 2006. Both applications are incorporated herein by reference in their entireties.

FIELD OF THE PRESENT INVENTION

The present invention relates generally to reference circuits for sampled-data circuits.

BACKGROUND OF THE PRESENT INVENTION

Most sampled-data analog circuits such as switched-capacitor filters, analog-to-digital converters, and delta-sigma modulators require operational amplifiers to process the signal. Consider a switched-capacitor integrator example shown in FIG. 2. First, the switches $S_{11}$ and $S_{13}$ are closed so that the input voltage $v_{In}$ is sampled on the sampling capacitor $C_{S1}$. Next, the switches $S_{11}$ and $S_{13}$ are opened and $S_{12}$ and $S_{14}$ are closed. This operation transfers the charge in the sampling capacitor $C_{S1}$ to the integrating capacitor $C_{I1}$. The output voltage, $v_{out}$, of a first integrator 1100 is typically sampled by another sampled-data circuit, for example, another switched-capacitor integrator. In the circuit shown in FIG. 2, the circuit consisting of switches $S_{21}$, $S_{22}$, $S_{23}$, $S_{24}$, and a second sampling capacitor $C_{s2}$ comprise a part of the second switched-capacitor integrator. The output voltage, $v_{out}$, of the first integrator 10 is sampled on the second sampling capacitor $C_{s2}$ by closing switches $S_{21}$ and $S_{23}$.

An example of a timing diagram is shown in FIG. 3. The clock signal has two non-overlapping phases $\phi_1$ and $\phi_2$. The phase $\phi_1$ is applied to switches $S_{11}$, $S_{13}$, $S_{21}$, and $S_{23}$, and phase $\phi_2$ is applied to switches $S_{12}$, $S_{14}$, $S_{22}$, and $S_{24}$. With this timing, the circuit performs non-inverting discrete integration with full clock delay. The waveforms at the output of the integrator, $v_{out}$, and at the virtual ground node 100, $v_1$, are also shown in FIG. 3. Different clock phasing arrangements yield different responses from the integrator. For example, if $\phi_1$ is applied to switches $S_{11}$, $S_{13}$, $S_{22}$, and $S_{24}$, and phase $\phi_1$ is applied to switches $S_{12}$, $S_{14}$, $S_{21}$, and $S_{23}$, the circuit performs non-inverting integration with half-clock delay.

For an accurate integration of the input signal, $v_1$ must be driven as close to ground as possible. In order to accomplish this, the operational amplifier must provide sufficient open-loop gain and low noise. In addition, for fast operation, the operational amplifier 10 of FIG. 2 must settle fast.

In FIG. 3, the voltage $v_1$ is shown to settle back to ground after a disturbance when the sampling capacitor $C_{S1}$ is switched to Node 100 by closing $S_{12}$ and $S_{14}$. In addition to high open-loop gain and fast settling time, operational amplifiers must provide large output swing for high dynamic range. As the technology scales, it becomes increasingly difficult to achieve these characteristics from operational amplifiers. The primary factors that make the operational amplifier design difficult are low power supply voltages and low device gain.

As noted above, accurate output voltage can be obtained if Node 100 in FIG. 2 is maintained precisely at ground. However, in sampled-data circuits, the only point of time accurate output voltage is required is at the instant the output voltage is sampled by another sampling circuit. Thus, it is not necessary to maintain the voltage at Node 100 at ground all the time.

Zero-crossing detectors can be applied in other switched-capacitor circuits such as algorithmic and pipeline analog-to-digital converters, delta-sigma converters, and amplifiers. These applications often require constant voltage sources, referred to as reference voltages.

Therefore, it is desirable to provide zero-crossing detectors in algorithmic analog-to-digital converters, pipeline analog-to-digital converters, delta-sigma converters, and amplifiers which apply voltage sources, such as reference voltages, in zero-crossing detector based circuits in a manner that reduces the power consumption required in such voltage sources without degrading noise performance or speed of zero-crossing based circuits.

SUMMARY OF THE PRESENT INVENTION

One aspect of the present invention is a comparator with effective offset cancellation. The comparator includes a first amplifier having an input terminal; an offset capacitor operatively connected to the first amplifier; a second amplifier, operatively connected to the offset capacitor; a first switch operatively connected to the input terminal; a second switch operatively connected between the offset capacitor and a first predetermined voltage; and a control circuit to control operations of the first and second switches. The first switch, in response to the control circuit, connects the input terminal to a second predetermined voltage during a time period. The second switch, in response to the control circuit, connects the offset capacitor to the first predetermined voltage during the time period. The time period is substantially shorter than a time constant associated with the offset capacitor.

Another aspect of the present invention is a comparator with effective offset cancellation. The comparator includes a first amplifier having an input terminal; a first offset capacitor operatively connected to the first amplifier; a second amplifier, operatively connected to the offset capacitor; a first switch operatively connected to the input terminal; a second switch operatively connected between the offset capacitor and a first predetermined voltage; a control circuit to control operations of the first and second switches; and a noise averaging circuit operatively connected to the first offset capacitor. The first switch, in response to the control circuit, connects the input terminal to a second predetermined voltage during a time period. The second switch, in response to the control circuit, connects the offset capacitor to the first predetermined voltage during the time period.

Another aspect of the present invention is a comparator based circuit with effective offset cancellation. The comparator based circuit includes a comparator to compare an input voltage with another voltage; a switched-capacitor network operatively connected to the comparator; an offset capacitor operatively connected to an input of the comparator; a preset voltage source, operatively connected to the offset capacitor, to charge the offset capacitor to a predetermined voltage; a waveform generator circuit, operatively connected to the offset capacitor, to apply a predetermined voltage waveform on the offset capacitor; and a sampling switch operatively connected to the offset capacitor. The sampling switch turns OFF when the comparator determines that a voltage at the input of the comparator crosses a predetermined level.

Another aspect of the present invention is a zero-crossing detector based circuit with effective offset cancellation. The zero-crossing detector based circuit includes a zero-crossing detector with a first input and a second input; a switched-capacitor network operatively connected to the zero-crossing detector; an offset capacitor operatively connected to the first input of the zero-crossing detector; a preset voltage source, operatively connected to the offset capacitor, to charge the offset capacitor to a predetermined voltage; a waveform generator circuit, operatively connected to the offset capacitor, to apply a predetermined voltage waveform on the offset capacitor; and a sampling switch operatively connected to the offset capacitor. The sampling switch turns OFF when the zero-crossing detector determines that a voltage at the first input crosses a ground potential.

Another aspect of the present invention is a level-crossing detector based circuit with effective offset cancellation. The level-crossing detector based circuit includes a level-crossing detector with a first input and a second input; a switched-capacitor network operatively connected to the level-crossing detector; an offset capacitor operatively connected to the first input of the level-crossing detector; a preset voltage source, operatively connected to the offset capacitor, to charge the offset capacitor to a predetermined voltage; a waveform generator circuit, operatively connected to the offset capacitor, to apply a predetermined voltage waveform on the offset capacitor; and a sampling switch operatively connected to the offset capacitor. The sampling switch turns OFF when the level-crossing detector determines that a voltage at the first input crosses a ground potential.

Another aspect of the present invention is a method of effectively cancelling offset in a zero-crossing detector based circuit. The method charges an offset capacitor to a predetermined voltage; applies a predetermined voltage waveform on the offset capacitor; determines if a voltage at an input of a zero-crossing detector has crossed a predetermined level; holds the voltage on the offset capacitor when it is determined that the voltage at the input of the zero-crossing detector has crossed the predetermined level; and cancels an offset of the zero-crossing detector using the voltage held on the offset capacitor when it is determined that the voltage at the input of the zero-crossing detector has crossed the predetermined level.

Another aspect of the present invention is a method of effectively cancelling offset in a level-crossing detector based circuit. The method charges an offset capacitor to a predetermined voltage; applies a predetermined voltage waveform on the offset capacitor; determines if a voltage at an input of a level-crossing detector has crossed a predetermined level; holds the voltage on the offset capacitor when it is determined that the voltage at the input of the level-crossing detector has crossed the predetermined level; and cancels an offset of the level-crossing detector using the voltage held on the offset capacitor.

Another aspect of the present invention is a method of effectively cancelling offset in comparator based circuit. The method charges an offset capacitor to a predetermined voltage; applies a predetermined voltage waveform on the offset capacitor; determines if a voltage at an input of a comparator has crossed a predetermined level; holds the voltage on the offset capacitor when it is determined that the voltage at the input of the comparator has crossed the predetermined level; and cancels an offset of the comparator using the voltage held on the offset capacitor.

BRIEF DESCRIPTION OF THE DRAWINGS

The present invention may take form in various components and arrangements of components, and in various steps and arrangements of steps. The drawings are only for purposes of illustrating a preferred embodiment and are not to be construed as limiting the present invention, wherein.

DETAILED DESCRIPTION OF THE PRESENT INVENTION

Figure 1:
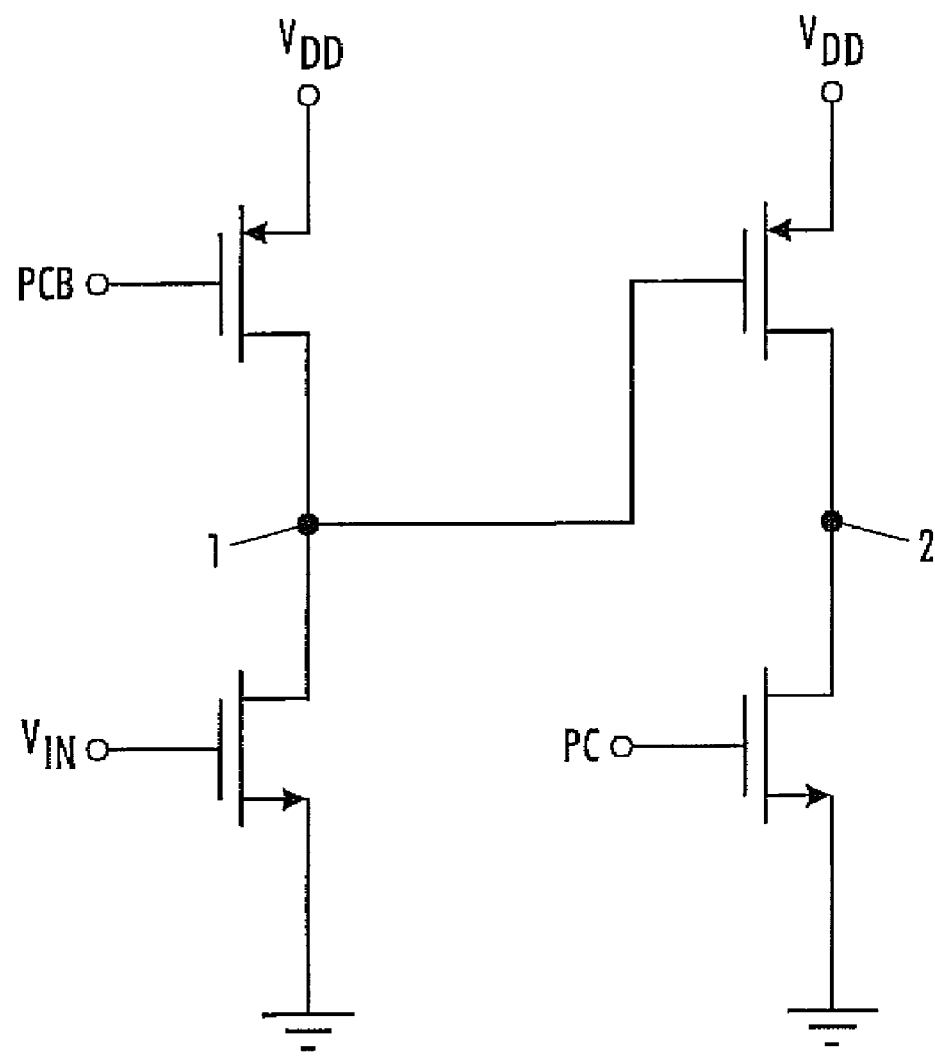
FIG. 1 illustrates a zero-crossing detector.

The present invention will be described in connection with preferred embodiments; however, it will be understood that there is no intent to limit the present invention to the embodiments described herein. On the contrary, the intent is to cover all alternatives, modifications, and equivalents as may be included within the spirit and scope of the present invention, as defined by the appended claims.

For a general understanding of the present invention, reference is made to the drawings. In the drawings, like reference have been used throughout to designate identical or equivalent elements. It is also noted that the various drawings illustrating the present invention may not have been drawn to scale and that certain regions may have been purposely drawn disproportionately so that the features and concepts of the present invention could be properly illustrated.

It is noted that, in the various Figures, the earth symbol indicates the system's common-mode voltage. For example, in a system with 2.5 V and −2.5 V power supplies, the system's common-mode voltage may be at ground. In a system with a single 2.5 power supply, the system's common-mode voltage may be at 1.25 V.

Figure 2:
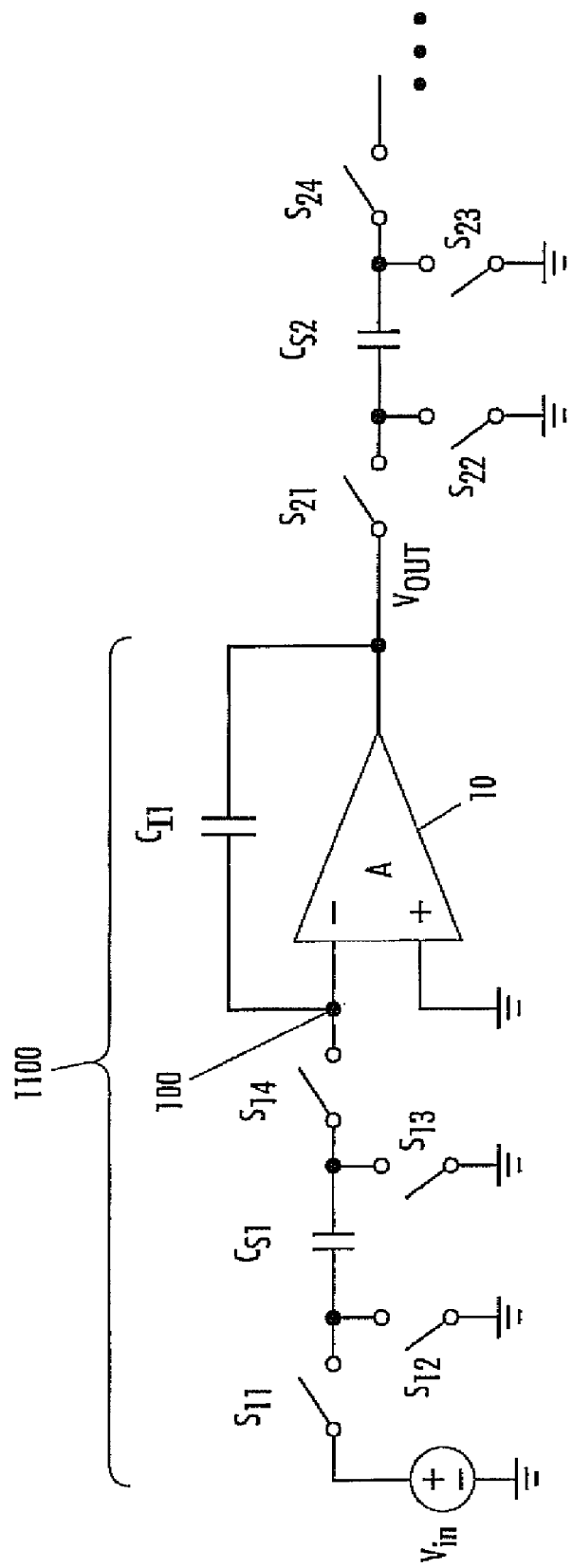
FIG. 2 illustrates a switched-capacitor integrator.
Figure 3:
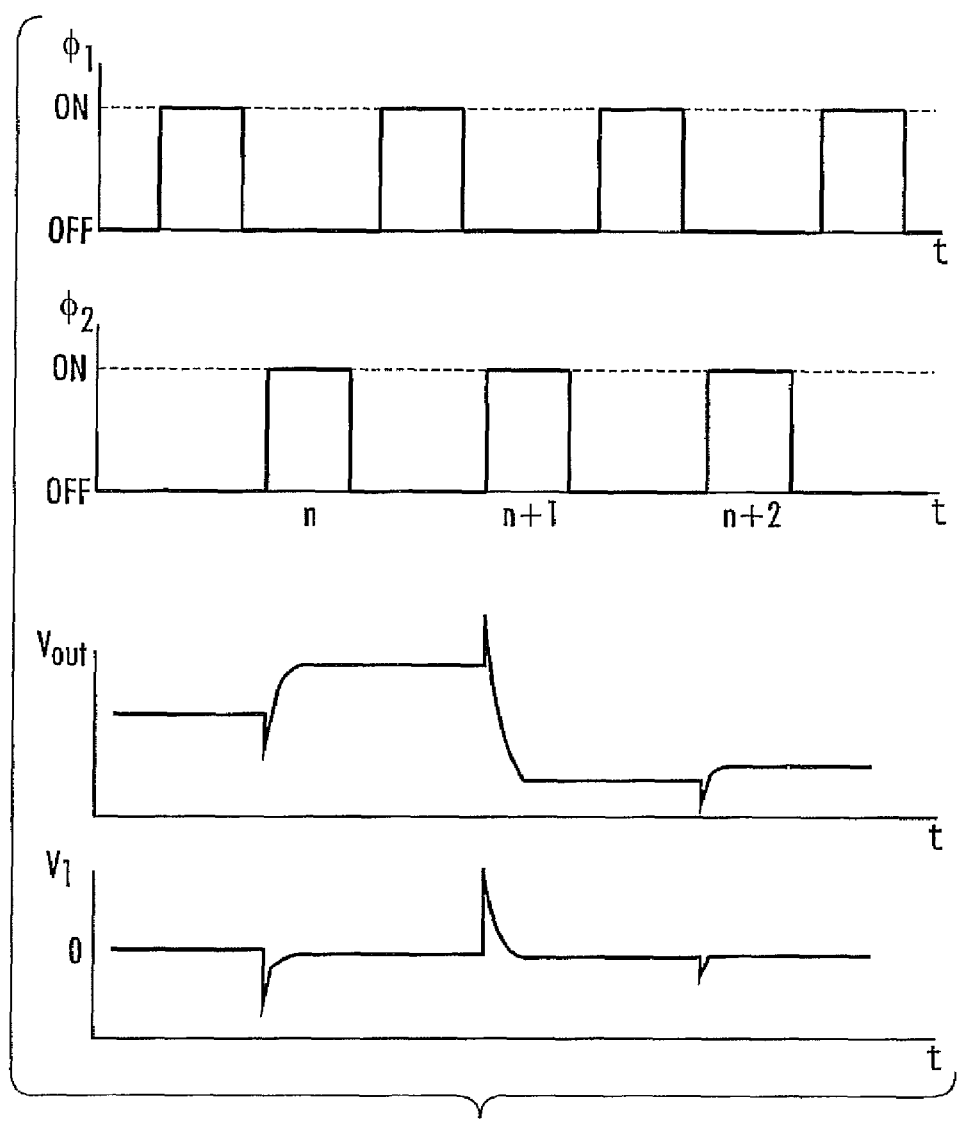
FIG. 3 illustrates a timing diagram for the switched-capacitor integrator of FIG. 2.

As noted above, accurate output voltage can be obtained if Node 100 in FIG. 2 is maintained precisely at ground. However, in sampled-data circuits, the only point of time accurate output voltage is required is at the instant the output voltage is sampled by another sampling circuit. Thus, it is not necessary to maintain the voltage at Node 100 at ground all the time.

Figure 4:
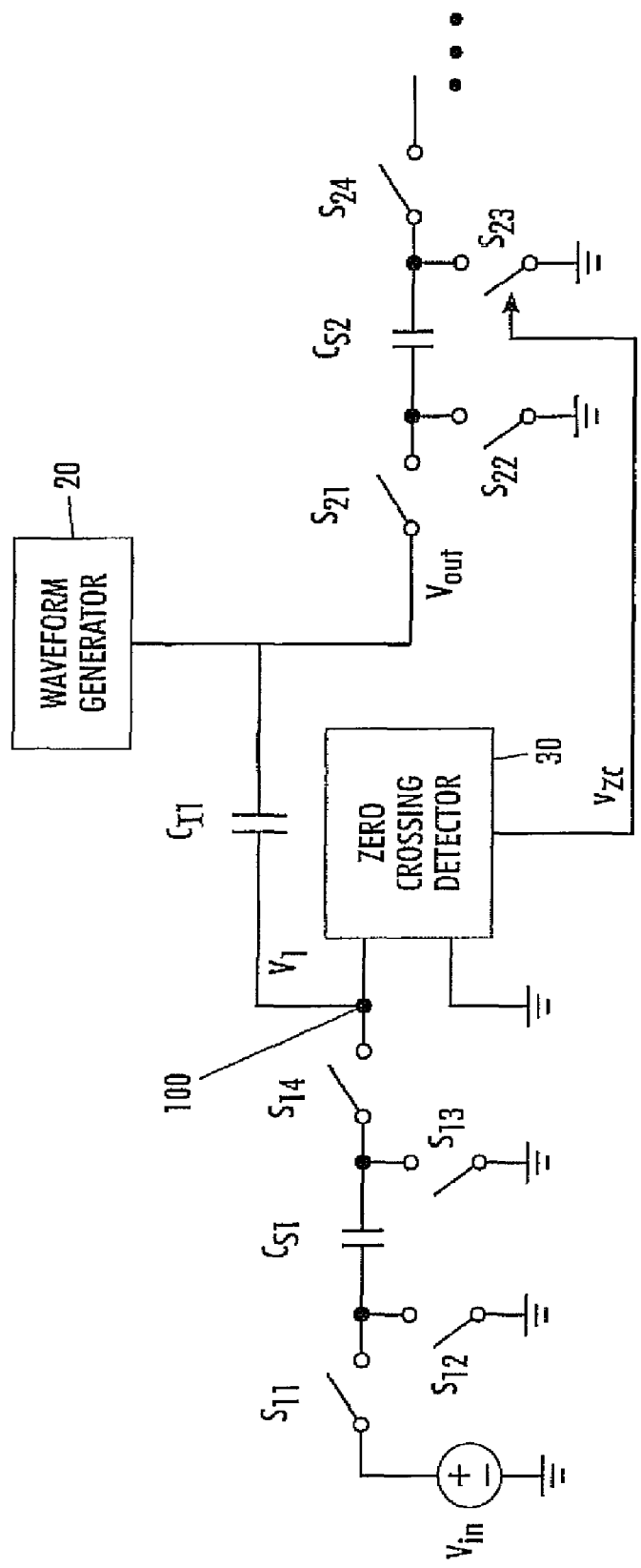
FIG. 4 illustrates a non-inverting integrator according to the concepts of the present invention.

FIG. 4 illustrates a non-inverting integrator according to the concepts of the present invention. More specifically, as an example, a non-inverting integrator with half-clock delay is illustrated in FIG. 4.

As illustrated in FIG. 4, a clock phase $\phi_1$ is applied to switches $S_{11}$, $S_{13}$, $S_{22}$, and $S_{24}$, and another phase $\phi_2$ is applied to switches $S_{12}$, $S_{14}$, and $S_{21}$. A zero crossing detector 30 is used to detect the point of time at which Node 100 crosses ground. The switch $S_{23}$ is controlled by the output of the zero crossing detector 30. The output of the zero crossing detector 30 is used to determine the time point to take the sample of the output voltage $v_{out}$. A waveform generator 20 generates a voltage waveform as the output voltage $v_{out}$ in such way the voltage at Node 100 crosses zero if the charge in capacitors $C_{S1}$ and $C_{I1}$ is within a normal operating range.

Figure 5:
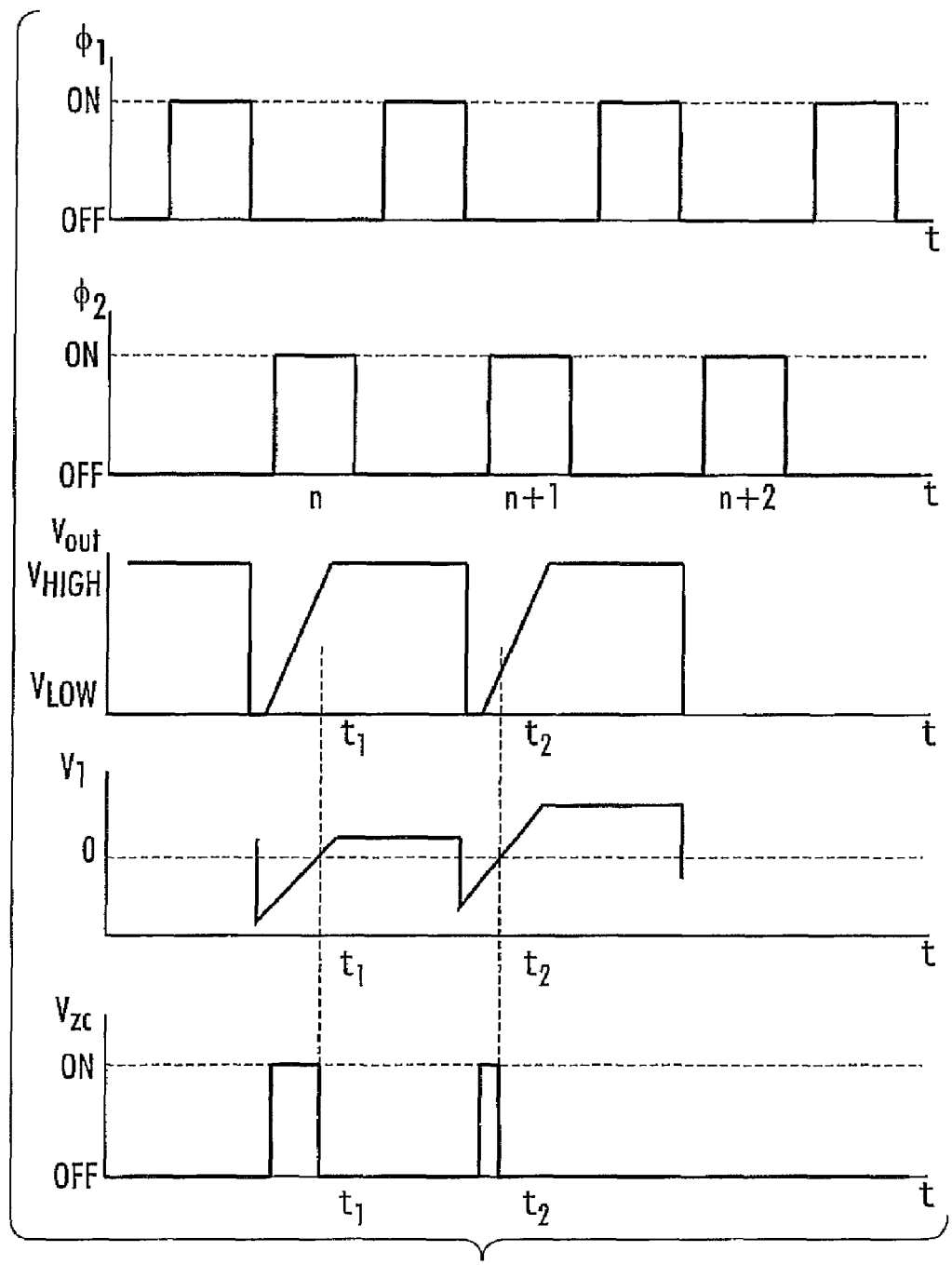
FIG. 5 illustrates a timing diagram for the non-inverting integrator of FIG. 4.

In the timing diagram shown in FIG. 5, the waveform generated by the waveform generator 20 is shown as a ramp. When $v_1$, the voltage at Node 100, crosses zero at time $t_1$, the output $v_{zc}$ of the zero crossing detector 30 goes low, turning the switch $S_{23}$ OFF. At that instant, the output voltage $v_{out}$ is sampled on $C_{S2}$.

Since $v_1$ is very close to zero when the sample of $v_2$ is taken, an accurate output voltage is sampled on $C_{S2}$. A similar operation repeats during the next clock cycle, and the sample of the output voltage is taken at time $t_2$.

It is noted that the zero crossing detector 30 may optionally have an overflow detection feature that determines when the charge in capacitors $C_{S1}$ and $C_{I1}$ is outside the normal range of operation. It can be implemented by a logic circuit that makes the output $v_{zc}$ of the zero-crossing detector 30 to go low when $\phi_2$ goes low. In the event $v_1$ fails to cross zero, the sample is taken on the falling edge of $\phi_2$. At the same time, the logic circuit produces a flag indicating overflow.

In the embodiment described above and in the various embodiments described below, a comparator may be utilized as a zero crossing detector. Typically, a comparator is designed to compare two arbitrary input voltages. A comparator may be implemented as cascaded amplifiers, a regenerative latch, or a combination of both. A comparator may be used to detect a zero voltage level or a predetermined voltage level crossing.

It is noted that the input waveform of the various described embodiments is not arbitrary, but deterministic and repetitive, Thus, the various described embodiments determine the instant the zero voltage level or the predetermined voltage level is crossed than relative amplitudes of the input signals. For such a deterministic input, a dynamic zero crossing detector is more efficient.

An example of a dynamic zero-crossing detector for the detection of a positive-going input signal is shown in FIG. 1. Initially, node 1 and node 2 are precharged to $V_{DD}$ and ground, respectively. The ramp input voltage $V_{IN}$ is applied according to the zero crossing circuit. At the time the input node crosses the threshold, node 1 is discharged rapidly, and node 2 is pulled up to $V_{DD}$. Since the zero crossing detector in FIG. 1 is a dynamic circuit, there is no DC power consumption, allowing extremely low power and fast operation. For the detection of zero-crossing of a negative-going signal, a complementary circuit with a PMS input transistor can be utilized.

Figure 6:
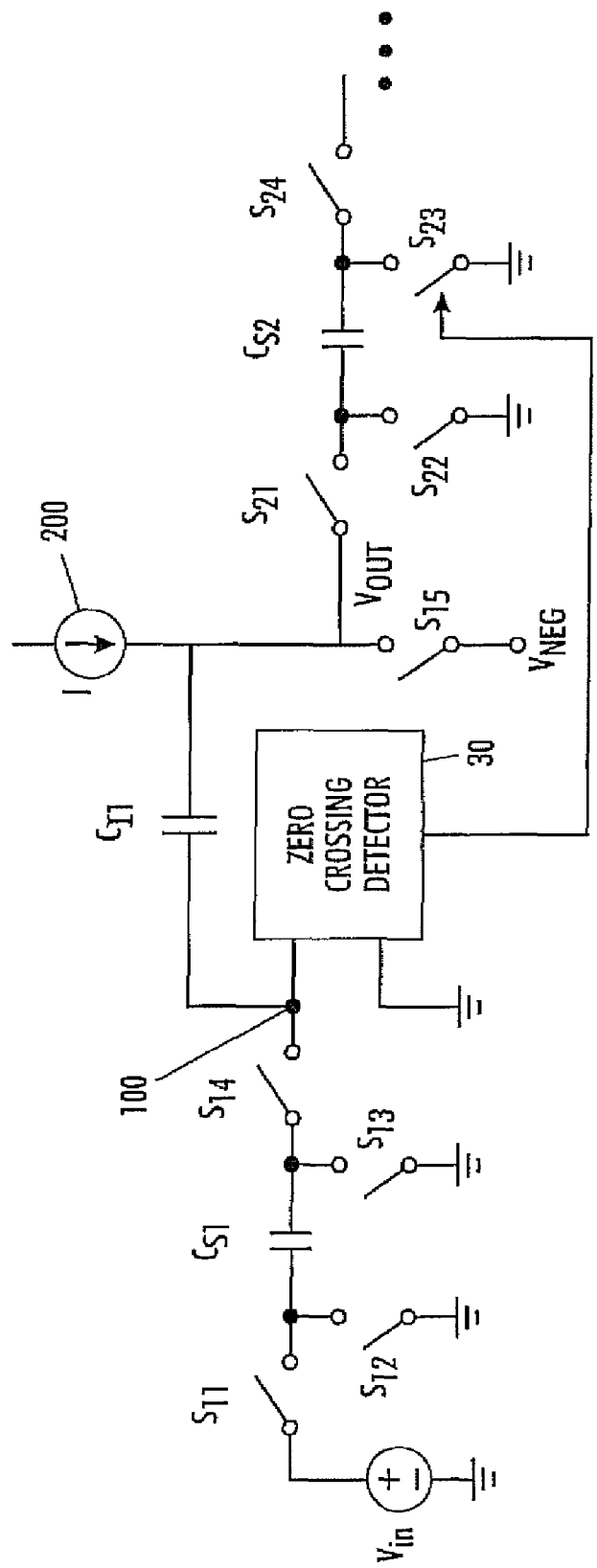
FIG. 6 illustrates a non-inverting integrator with a waveform generator being a current source according to the concepts of the present invention.

As illustrated in FIG. 6, the non-inverting integrator includes a waveform generator which is a current source 200. As illustrated in FIG. 6, a clock phase $\phi_1$ is applied to switches $S_{11}$, $S_{13}$, $S_{22}$, and $S_{24}$, and another phase $\phi_2$ is applied to switches $S_{12}$, $S_{14}$, and $S_{21}$. A zero crossing detector 30 is used to detect the point of time at which Node 100 crosses ground. The switch $S_{23}$ is controlled by the output of the zero crossing detector 30. The output of the zero crossing detector 30 is used to determine the time point to take the sample of the output voltage $v_{out}$.

The current source 200 charges the capacitors $C_{S2}$ and the series connected $C_{S1}$ and $C_{I1}$, generating a ramp. At the start of $\phi_2$, the output is briefly shorted to a known voltage $V_{NEG}$, the value of which is chosen to ensure the voltage $v_1$ at Node 100 crosses zero with signals in the normal operating range.

Figure 7:
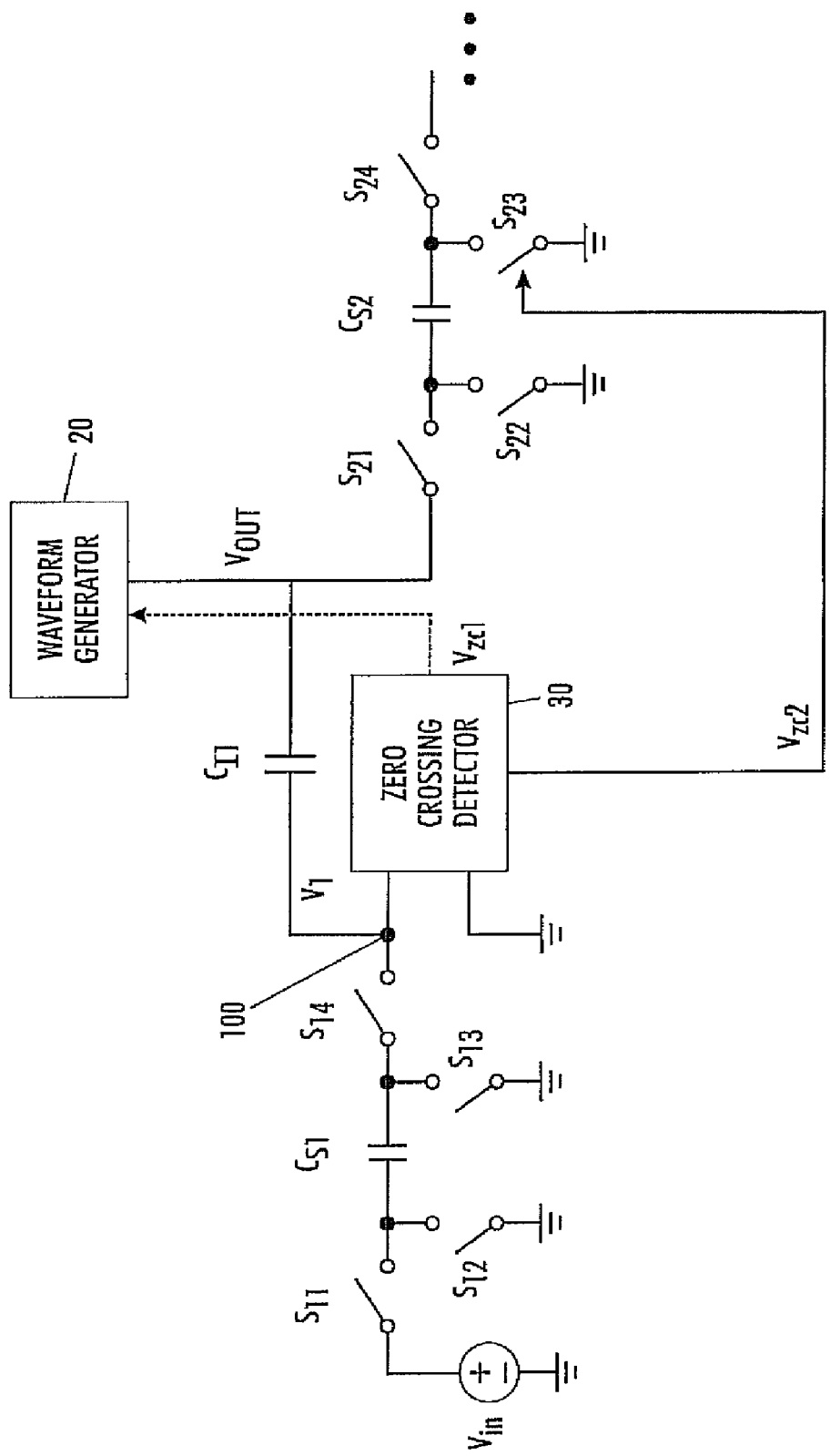
FIG. 7 illustrates another non-inverting integrator according to the concepts of the present invention.

As illustrated in FIG. 7, the non-inverting integrator includes a waveform generator 20 that produces, preferably, a plurality of segments in the waveform with varying rate of change of the output voltage. The first segment may be controlled so as to have the highest rate of change, with subsequent segments having progressively lower rate of change. The detection of zero crossing by the zero crossing detector 30 causes the waveform to advance to the next segment. An output signal $v_{zc2}$ of the zero crossing detector 30 remains high until the zero crossing is detected in the last segment of the waveform.

Figure 8:
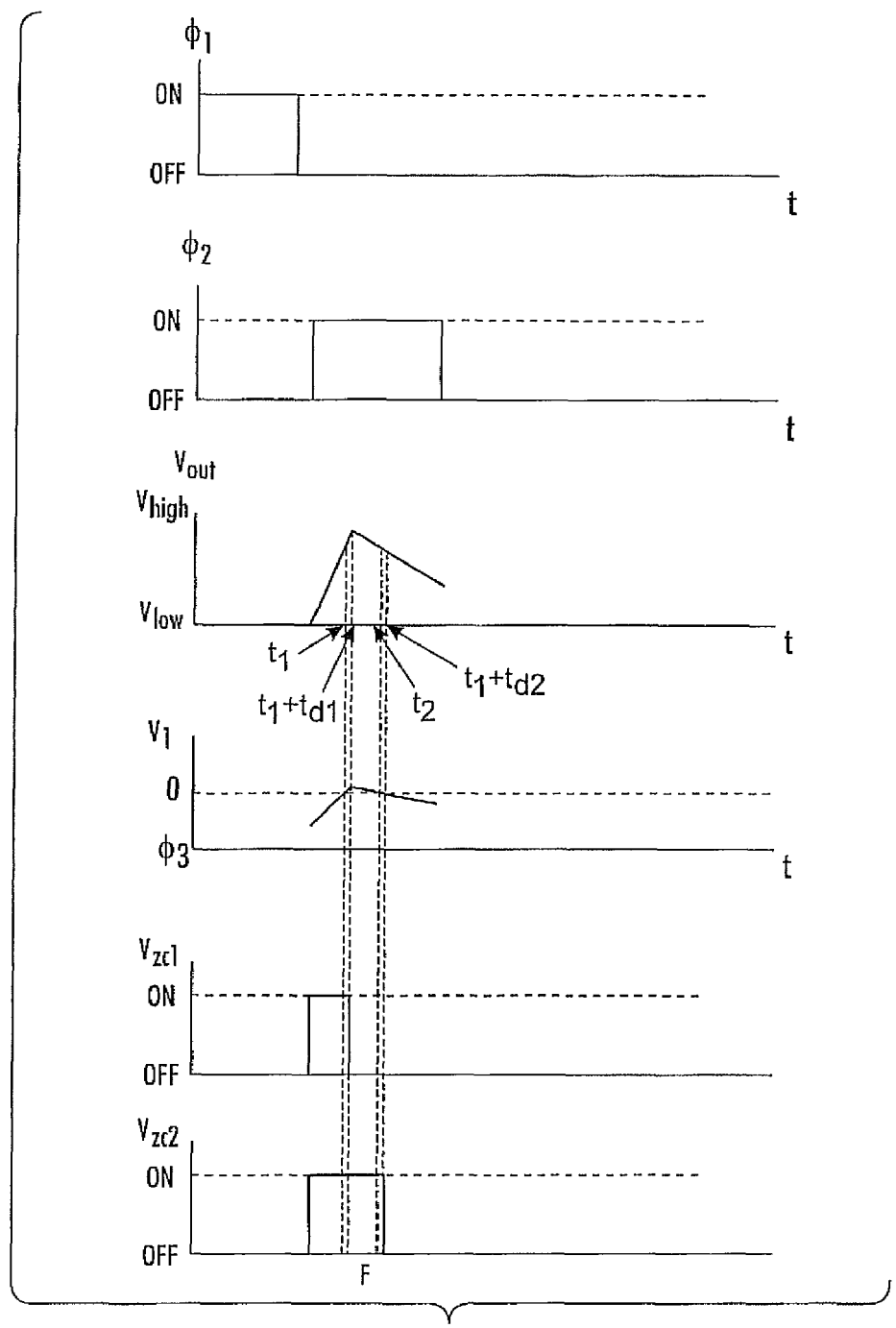
FIG. 8 illustrates a timing diagram for the non-inverting integrator of FIG. 7.

One clock cycle of the timing diagram is shown in FIG. 8. At the start of $\phi_2$, the waveform generator 20 produces an up ramp. The voltage $v_1$ is shown to cross zero at time $t_1$. One output, $v_{zc1}$, of the zero crossing detector 30 changes its state after a finite delay $t_{d1}$.

The delay $t_{d1}$ represents finite delay of a typical zero crossing detector 30. This change of state advances the waveform to the next segment.

Due to the $t_{d1}$ of the zero crossing detector 30, the voltage $v_1$ overshoots by a small amount above ground. The second segment of the waveform generator is a down ramp to permit another zero crossing at time $t_2$. After a second delay $t_{d2}$, the output $v_{zc2}$ of the zero crossing detector 30 goes low, causing the switch $S_{23}$ to turn OFF, locking the sample of the output voltage $v_{out}$.

The delay $t_{d2}$ of the second zero crossing is not necessarily the same as the delay associated with the first zero crossing $t_{d1}$. The delay $t_{d2}$ contributes a small overshoot to the sampled output voltage. The effect of the overshoot can be shown to be constant offset in the sampled charge. In most sampled-data circuits, such constant offset is of little issue.

The zero crossing detector 30 preferably becomes more accurate in detecting the zero crossing as the segments of the waveform advances. The first detection being a coarse detection, it does not have to be very accurate. Therefore, the detection can be made faster with less accuracy. The last zero crossing detection in a given cycle determines the accuracy of the output voltage. For this reason, the last zero crossing detection must be the most accurate.

The accuracy, speed, and the power consumption can be appropriately traded among progressive zero crossing detections for the optimum overall performance. For example, the first detection is made less accurately and noisier but is made faster (shorter delay) and lower power. The last detection is made more accurately and quieter while consuming more power or being slower (longer delay).

An example of a two-segment waveform generator constructed of two current sources (210 and 220) is shown in FIG.

Figure 9:
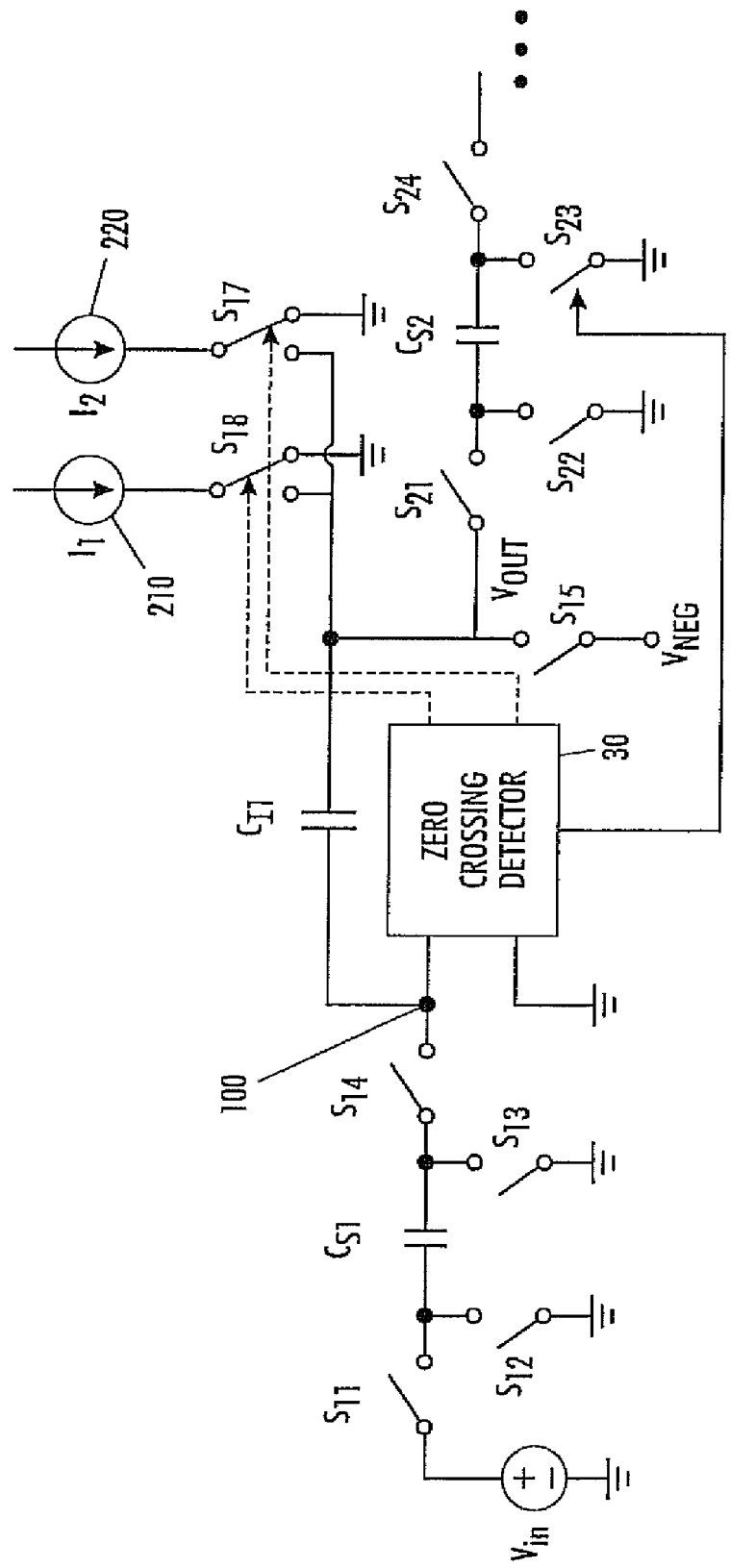
FIG. 9 illustrates another non-inverting integrator according to the concepts of the present invention.

9. As illustrated in FIG. 9, a clock phase $\phi_1$ is applied to switches $S_{11}$, $S_{13}$, $S_{22}$, and $S_{24}$, and another phase $\phi_2$ is applied to switches $S_{12}$, $S_{14}$, and $S_{21}$. A zero crossing detector 30 is used to detect the point of time at which Node 100 crosses ground. The switch $S_{23}$ is controlled by the output of the zero crossing detector 30. The output of the zero crossing detector 30 is used to determine the time point to take the sample of the output voltage $v_{out}$.

Current sources 210 and 220 charge the capacitors $C_{S2}$ and the series connected $C_{S1}$ and $C_{I1}$ generating two segments of a ramp waveform. At the start of $\phi_2$, the output is briefly shorted to a known voltage $V_{NEG}$, the value of which is chosen to ensure the voltage $v_1$ crosses zero with signals in the normal operating range. During the first segment, the current source 210 is directed to the output, while during the second segment, the current source 220 is directed to the output, generating two different slopes of ramp.

Figure 10:
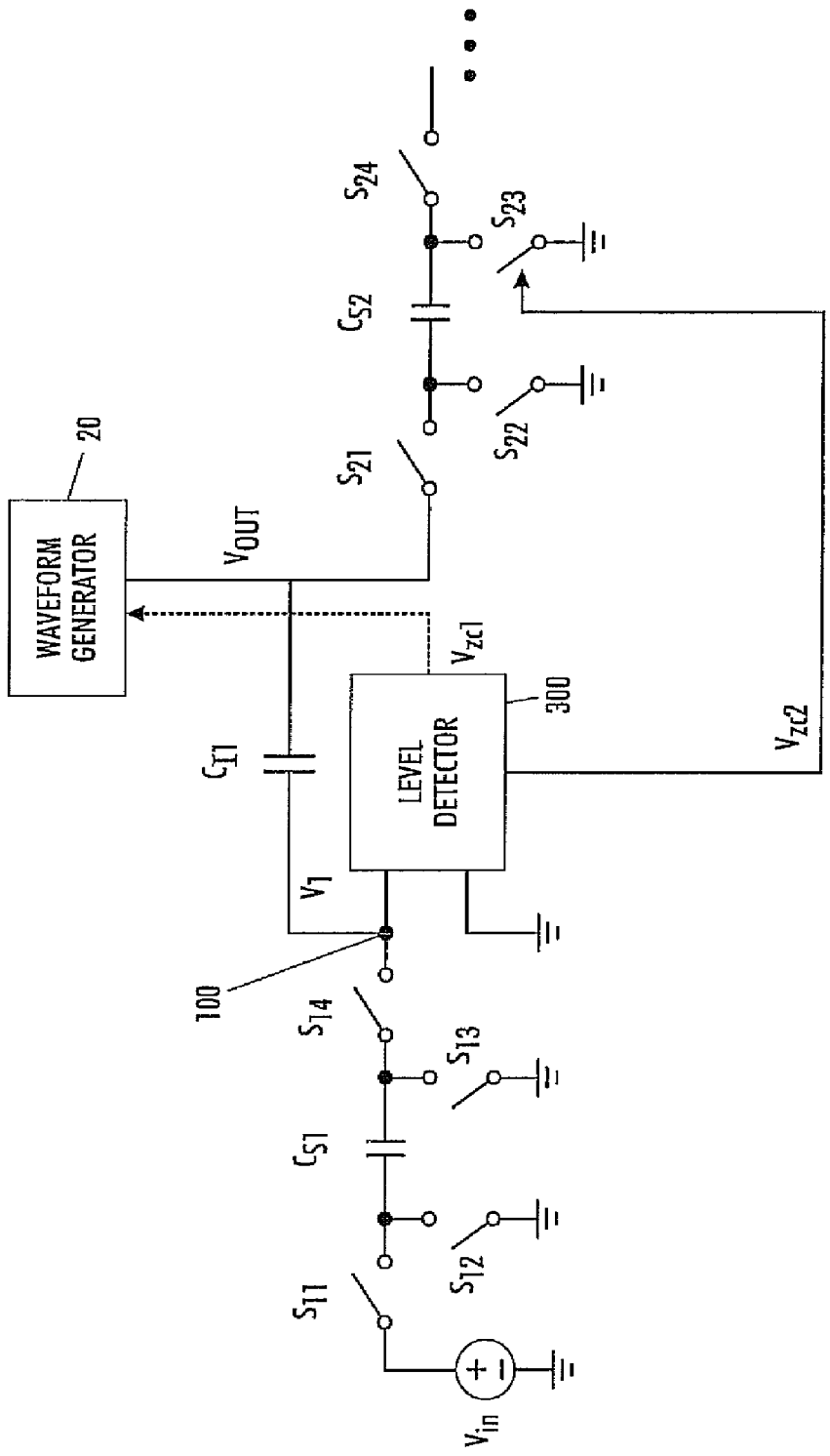
FIG. 10 illustrates another non-inverting integrator according to the concepts of the present invention.

As illustrated in FIG. 10, the non-inverting integrator includes a level crossing detector 300 having plurality of thresholds. As illustrated in FIG. 10, a clock phase $\phi_1$ is applied to switches $S_{11}$, $S_{13}$, $S_{22}$, and $S_{24}$, and another phase $\phi_2$ is applied to switches $S_{12}$, $S_{14}$, and $S_{21}$. A level crossing detector 300 is used to detect the point of time at which Node 100 crosses one of plurality of predetermined levels as discussed below. The switch $S_{23}$ is controlled by the output of the level crossing detector 300. The output of the level crossing detector 300 is used to determine the time point to take the sample of the output voltage $v_{out}$.

The thresholds are predetermined voltage levels. The thresholds of the level crossing detector 300 can be adjusted to minimize overshoot.

Figure 11:
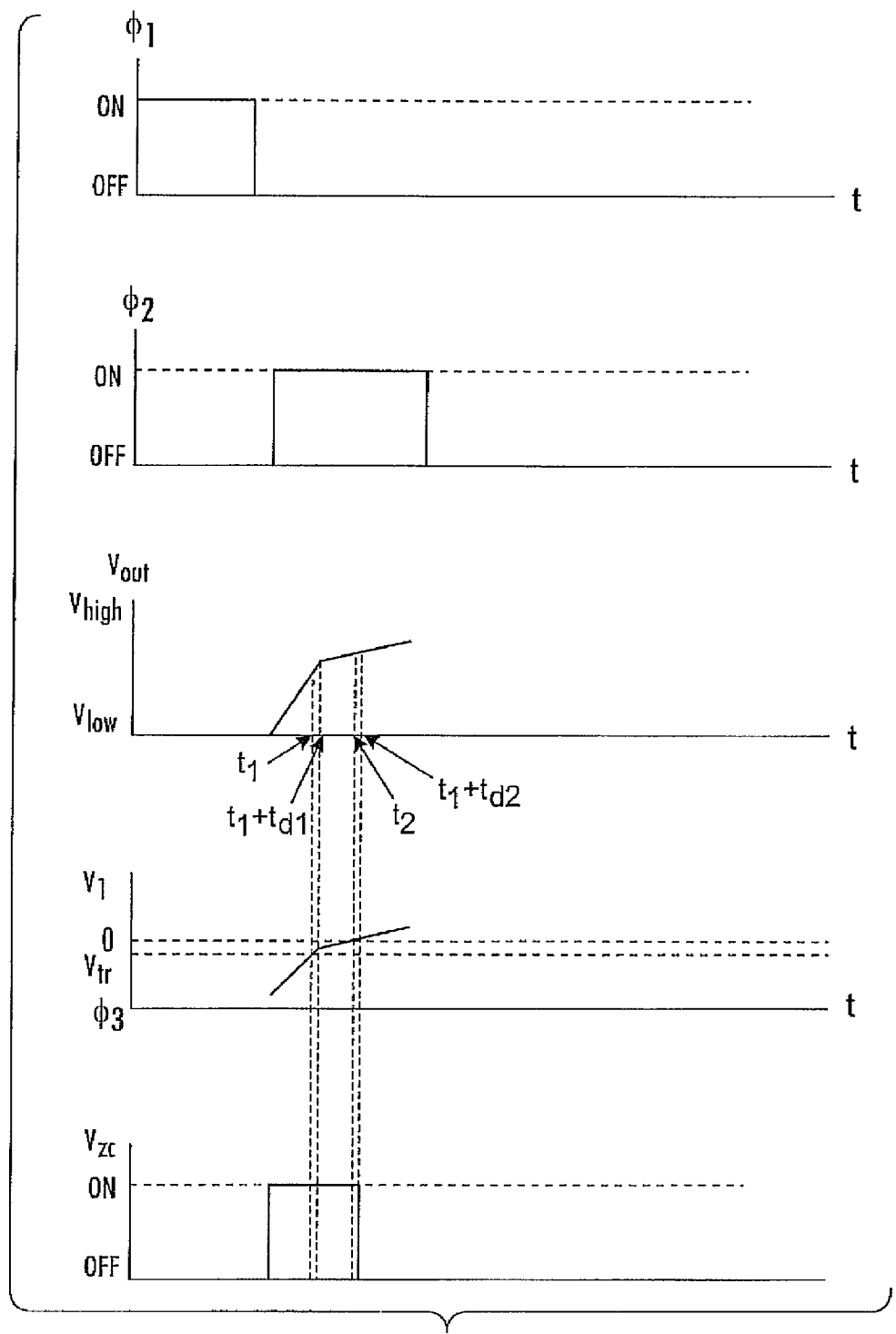
FIG. 11 illustrates a timing diagram for the non-inverting integrator of FIG. 10.

For example, the threshold for the first detection may be made negative by a slightly smaller amount than the expected overshoot in the first segment. This minimizes the ramp-down time in the second segment. Also, the threshold for the second segment may be made more positive by the amount of the overshoot in the second segment in order to cancel the effect of the overshoot. Alternatively, the threshold for the first segment may be made more negative than the expected overshoot during the first segment. This permits the second segment to be a positive ramp rather than a negative ramp as shown in FIG. 11.

It is advantageous to make the detection during the last segment to be the most accurate detection. The accuracy of the detection during the last segment is made higher than during other segments. This can be achieved by making the delay longer or making the power consumption higher during the last segment.

Figure 12:
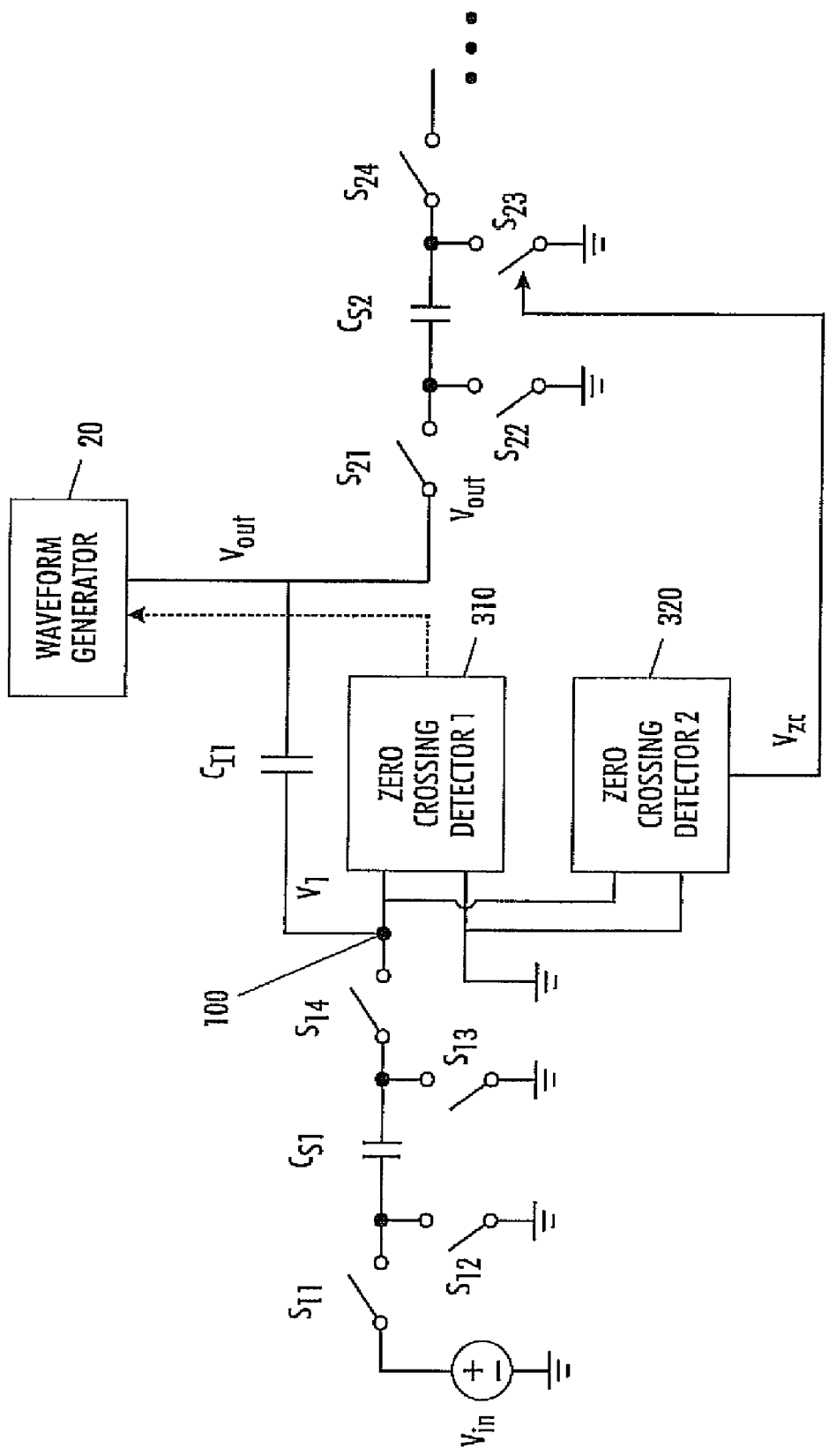
FIG. 12 illustrates another non-inverting integrator according to the concepts of the present invention.

As illustrated in FIG. 12, the non-inverting integrator includes a level crossing detector having two zero-crossing detectors, Zero Crossing Detector 1 (310) and Zero Crossing Detector 2 (320). As illustrated in FIG. 12, a clock phase $\phi_1$ is applied to switches $S_{11}$, $S_{13}$, $S_{22}$, and $S_{24}$, and another phase $\phi_2$ is applied to switches $S_{12}$, $S_{14}$, and $S_{21}$. Zero Crossing Detector 1 (310) and Zero Crossing Detector 2 (320) are used to detect the point of time at which Node 100 crosses one of plurality of predetermined levels as discussed below. The switch $S_{23}$ is controlled by the output of the Zero Crossing Detector 2 (320). The output of the Zero Crossing Detector 2 (320) is used to determine the time point to take the sample of the output voltage $v_{out}$.

The thresholds of the Zero Crossing Detector 1 (310) and Zero Crossing Detector 2 (320) are selected to minimize overshoot. For example, the threshold for Zero Crossing Detector 1 (310) may be made negative by a slightly smaller amount than the expected overshoot in the first segment. This minimizes the ramp-down time in the second segment. Also, the threshold for Zero Crossing Detector 2 (320) may be made more positive by the amount of the overshoot in the second segment in order to cancel the effect of the overshoot. Alternatively, the threshold for Zero Crossing Detector 1 (310) may be made more negative than the expected overshoot during the first segment. This permits Zero Crossing Detector 2 (320) to be a positive ramp rather than a negative ramp.

In other words, Zero Crossing Detector 1 (310) makes a coarse detection, whereas Zero Crossing Detector 2 (320) makes a fine detection. Thus, it is advantageous to make Zero Crossing Detector 2 (320) to have a higher accuracy.

Figure 13:
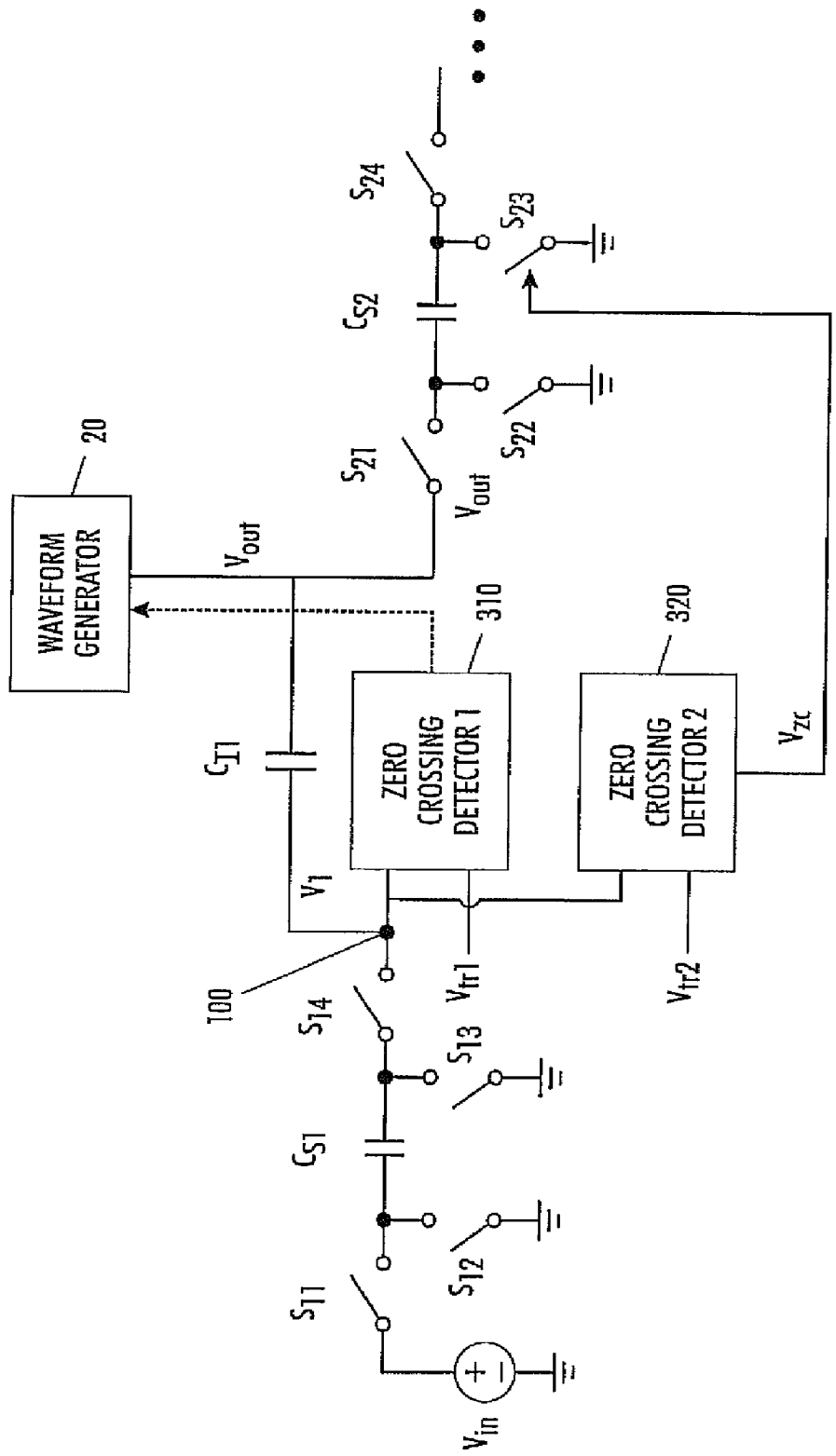
FIG. 13 illustrates another non-inverting integrator according to the concepts of the present invention.

As illustrated in FIG. 13, the non-inverting integrator includes a level crossing detector having two zero-crossing detectors, Zero Crossing Detector 1 (310) and Zero Crossing Detector 2 (320). As illustrated in FIG. 13, a clock phase $\phi_1$ is applied to switches $S_{11}$, $S_{13}$, $S_{22}$, and $S_{24}$, and another phase $\phi_2$ is applied to switches $S_{12}$, $S_{14}$, and $S_{21}$. Zero Crossing Detector 1 (310) and Zero Crossing Detector 2 (320) are used to detect the point of time at which Node 100 crosses one of plurality of predetermined levels as discussed below. The switch $S_{23}$ is controlled by the output of the Zero Crossing Detector 2 (320). The output of the Zero Crossing Detector 2 (320) is used to determine the time point to take the sample of the output voltage $v_{out}$.

Both detectors, Zero Crossing Detector 1 (310) and Zero Crossing Detector 2 (320), have nominally zero thresholds. The detection thresholds are determined by voltages $V_{tr1}$ and $V_{tr2}$ applied to the inputs of Zero Crossing Detector 1 (310) and Zero Crossing Detector 2 (320), respectively. Zero Crossing Detector 1 (310) makes a coarse detection, whereas Zero Crossing Detector 2 (320) makes a fine detection. Thus, it is advantageous to make Zero Crossing Detector 2 (320) to have a higher accuracy.

Figure 14:
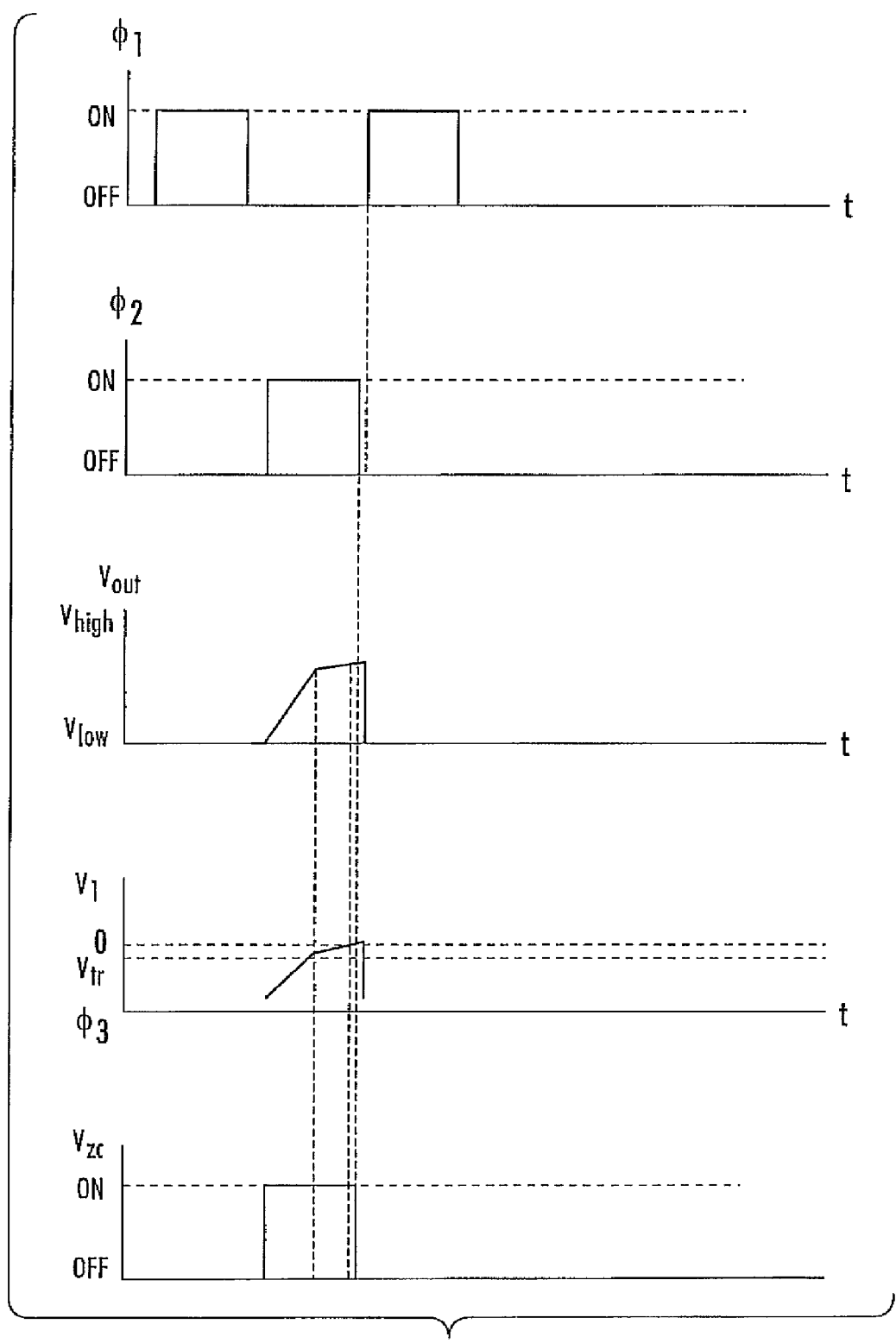
FIG. 14 illustrates a timing diagram for the non-inverting integrator of FIG. 13.

It is noted that the above-described embodiment may operate as a self-timed system. In this configuration, Rather than supplying constant frequency clock phases $\phi_1$ and $\phi_2$, the clock phases are derived from the outputs of Zero Crossing Detector 1 (310) and Zero Crossing Detector 2 (320). FIG. 14 illustrates a self-timed operation.

As illustrated in FIG. 14, the end of the phase $\phi_2$ is defined by the output of the detection during the last segment. The beginning of the clock phase $\phi_1$ is defined by a short delay, such as logic delays, after the end of $\phi_2$. The short delay is generally necessary to ensure non-overlapping clock phases. The end of the clock phase $\phi_1$ is determined by the zero crossing detection of the previous stage or the following stage in the similar manner.

It is noted that zero crossing detector based circuits require substantially less power consumption compared with operational amplifier based circuits at a given sampling rate and signal-to-noise ratio because the noise bandwidth of a zero crossing detector is much lower than that of an operational amplifier at a given sampling rate. Zero crossing detectors can be applied in other switched-capacitor circuits such as algorithmic and pipeline analog-to-digital converters, delta-sigma converters, and amplifiers.

In applications where high precision is required, the effects of the offset voltage due to device mismatch must be mitigated. In switched-capacitor circuits, offset cancellation techniques are often employed to reduce the offset voltage.

Figure 15:
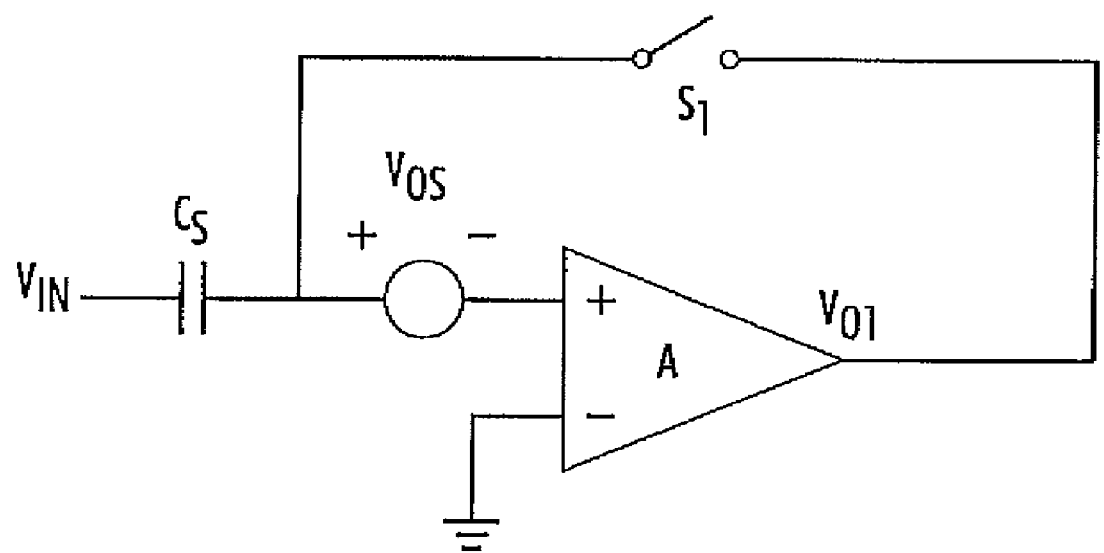
FIG. 15 illustrates a closed-loop offset cancellation circuit.

An example of a circuit with closed-loop offset cancellation is illustrated in FIG. 15, As illustrated in FIG. 15, during the sampling phase, the input voltage $V_{IN}$ is applied to the sampling capacitor $C_S$, and the switch $S_1$ is closed. The voltage sampled on $C_S$ is $V_{IN}$-$V_{OS}$. The voltage sampled on $C_s$ cancels the effect of offset voltage due to device mismatch. It is noted that a control or logic circuit (not shown) is utilized to control the operations of switches $S_1$ and $S_2$.

In zero-crossing detector based circuits, similar closed-loop offset cancellation results are feasible by closing the loop around the first stage of the zero-crossing detector. The noise bandwidth during the closed-loop offset sampling is comparable to that in operational amplifier based circuits. The high noise bandwidth of the closed-loop offset sampling adds significant amount of noise and at least partially negates the low noise advantage of zero-crossing detector based circuits.

Figure 16:
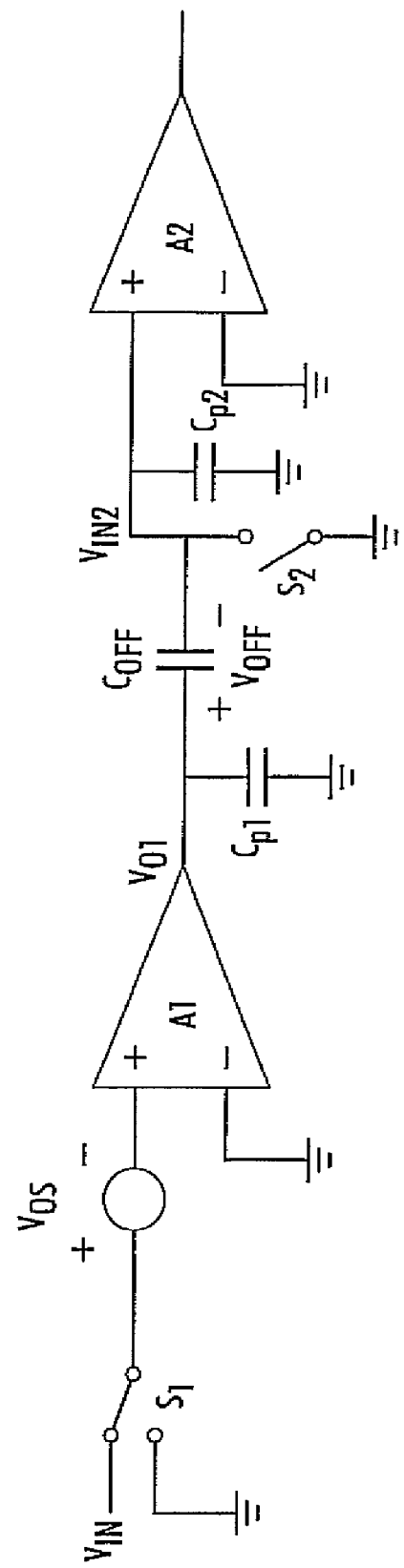
FIG. 16 illustrates an open-loop offset cancellation circuit.
Figure 17:
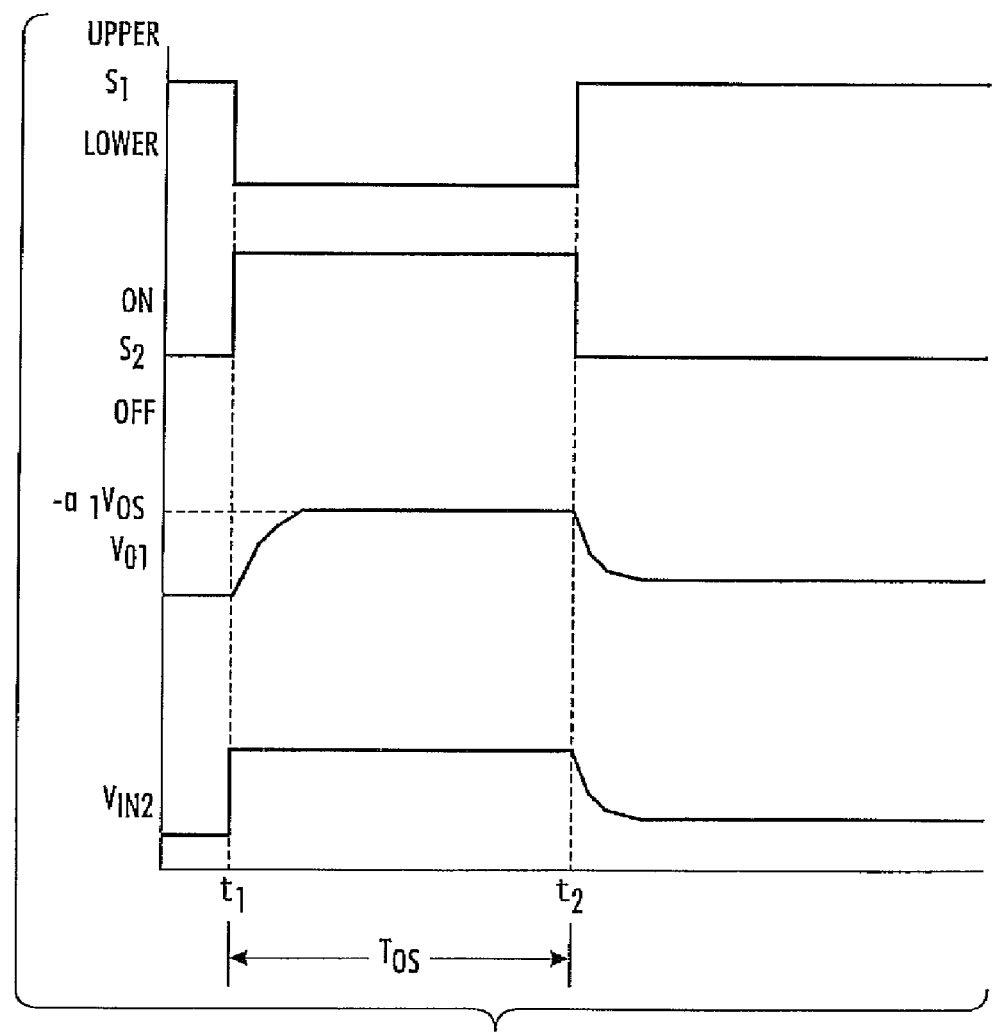
FIG. 17 illustrates a timing diagram for the open-loop offset cancellation circuit of FIG. 16.

An open-loop offset cancellation is illustrated in FIG. 16. As illustrated in FIG. 16, open-loop offset cancellation can be used with voltage comparators. The timing diagram for the open-loop offset cancellation is shown in FIG. 17. During the offset sampling phase, $T_{OS}$, the input of the first amplifier $A_1$ is connected to ground through switch $S_1$. The input of the second amplifier $A_2$ is also connected to ground by closing the switch $S_2$. The output voltage of the first amplifier $A_1$ settles to $-a_1 V_{OS}$, where $a_1$ is the voltage gain of the amplifier $A_1$.

The settling time constant $\tau$ is equal to $R_o C$ where $R_o$ is the Thevenin output resistance of the first amplifier $A_1$, and C is the parallel combination of parasitic capacitance $C_{p1}$ and $C_{OS}$. The switch $S_2$ is then opened, whereby $-a_1 V_{OS}$ is sampled and held across the offset storage capacitor $C_{OFF}$. During the normal operation phase, switch $S_1$ connects the input of first amplifier $A_1$ to the voltage $V_{IN}$. The effective input voltage to first amplifier $A_1$ is $V_{IN}-V_{OS}$ due to the effect of the offset voltage $V_{OS}$.

The output voltage of first amplifier $A_1$ is then $a_1(V_{IN}-V_{OS})$. The input voltage to second amplifier $A_2$ is $a_1(V_{IN}-V_{OS})-(-a_1 V_{OS})=a_1 V_{IN}$. Thus, the effect of the offset voltage of the first amplifier $A_1$ is removed.

For accurate offset cancellation, the offset cancellation phase $T_{OS}$ must be at least several times longer than the time constant $\tau$. This requires wide bandwidth in the first amplifier $A_1$ which corresponds to high noise. Although it is possible to employ the open-loop offset cancellation in zero-crossing detectors, as with the closed-loop offset cancellation, the high noise bandwidth of the open-loop offset sampling adds significant amount of noise and partially negates the low noise advantage of zero-crossing detector based circuits.

As noted above, it is desirable to provide offset cancellation in zero crossing detectors without substantially increasing the noise of zero-crossing detectors. An example of offset cancellation in zero crossing detectors can be realized using the same circuit structure, as illustrated in FIG. 15, but with different timing and a different capacitor value for $C_{OFF}$. An example of a timing diagram for offset cancellation in zero crossing detectors is shown in FIG. 18.

Figure 18:
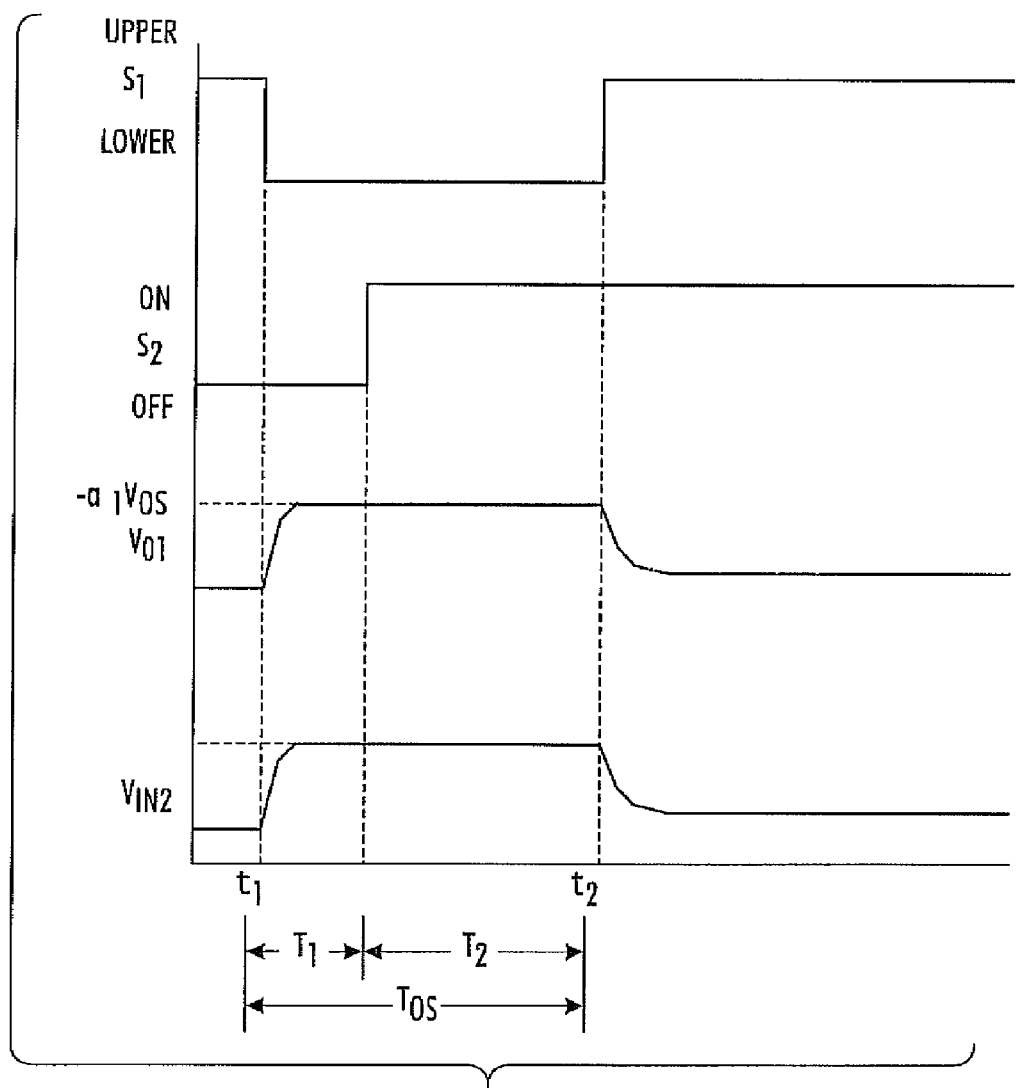
FIG. 18 illustrates another timing diagram for the open-loop offset cancellation circuit of FIG. 16.

As illustrated in FIG. 18, the offset cancellation phase $T_{OFF}$ is divided into two sub-phases, $T_1$ and $T_2$. During the phase $T_1$, switch $S_1$ is connected to ground while switch $S_2$ is still open. The settling time constant $\tau_1$ during this phase is approximately $R_o(C_{p1}+C_{p2})$, assuming $C_{OFF} \gg C_{p2}$. Since both $C_{p1}$ and $C_{p2}$ are small parasitic capacitances, $\tau_1$ is short. Therefore, the output voltage $V_{o1}$ quickly settles to $-a_1 V_{OS}$.

During the phase $T_2$, switch $S_2$ is closed with switch $S_1$ still connected to ground. The offset storage capacitor $C_{OFF}$ is made substantially larger such that the settling time constant $\tau_2 = R_o C$ during $T_2$ is comparable to or longer than $T_2$. Such a long time constant reduces the noise bandwidth during the phase $T_2$. The bandwidth of noise sampled in $C_{OFF}$ is determined by $\tau_2$, thereby providing low noise.

Although $\tau_2$ is long, the accuracy of offset cancellation is not affected because the voltage across $C_{OFF}$ reaches $-a_1 V_{OS}$, and there is no change in the voltage across $C_{OFF}$ during $T_2$.

In practice, small disturbance in the voltage occurs at the time switch $S_2$ is closed due to capacitive coupling. The disturbance is constant and also reduced by $a_1$ when referred to the input, and hence poses little concern in most systems.

After the offset cancellation is complete, the switch $S_1$ is connected to $V_{IN}$, and switch $S_2$ is open for normal operation as a zero-crossing detector or a comparator.

Figure 19:
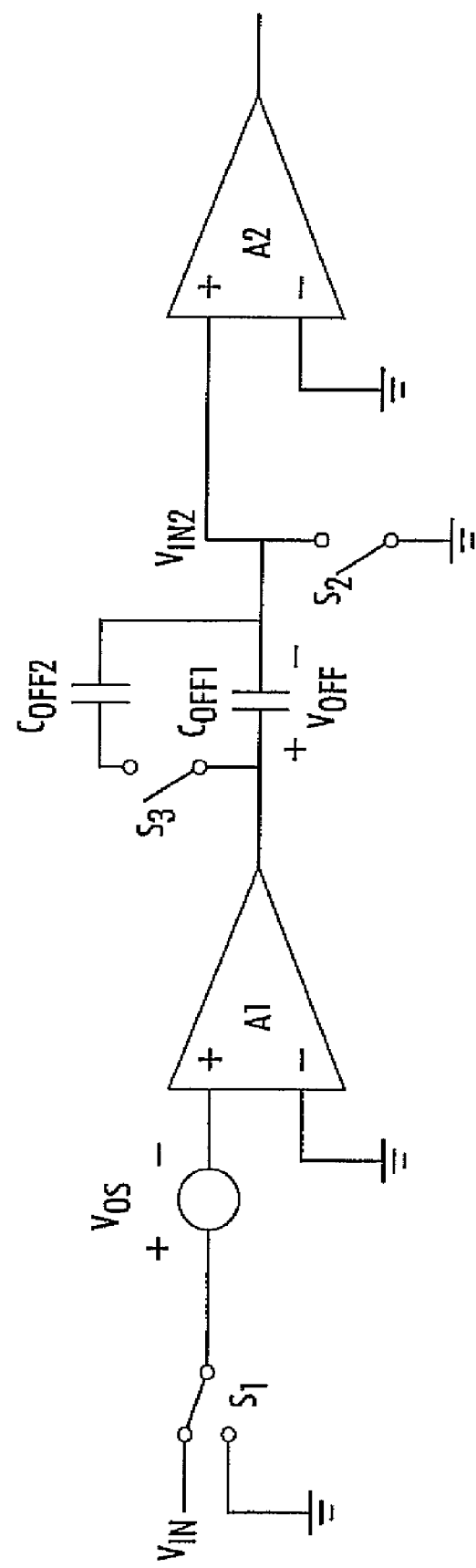
FIG. 19 illustrates another open-loop offset cancellation circuit.
Figure 20:
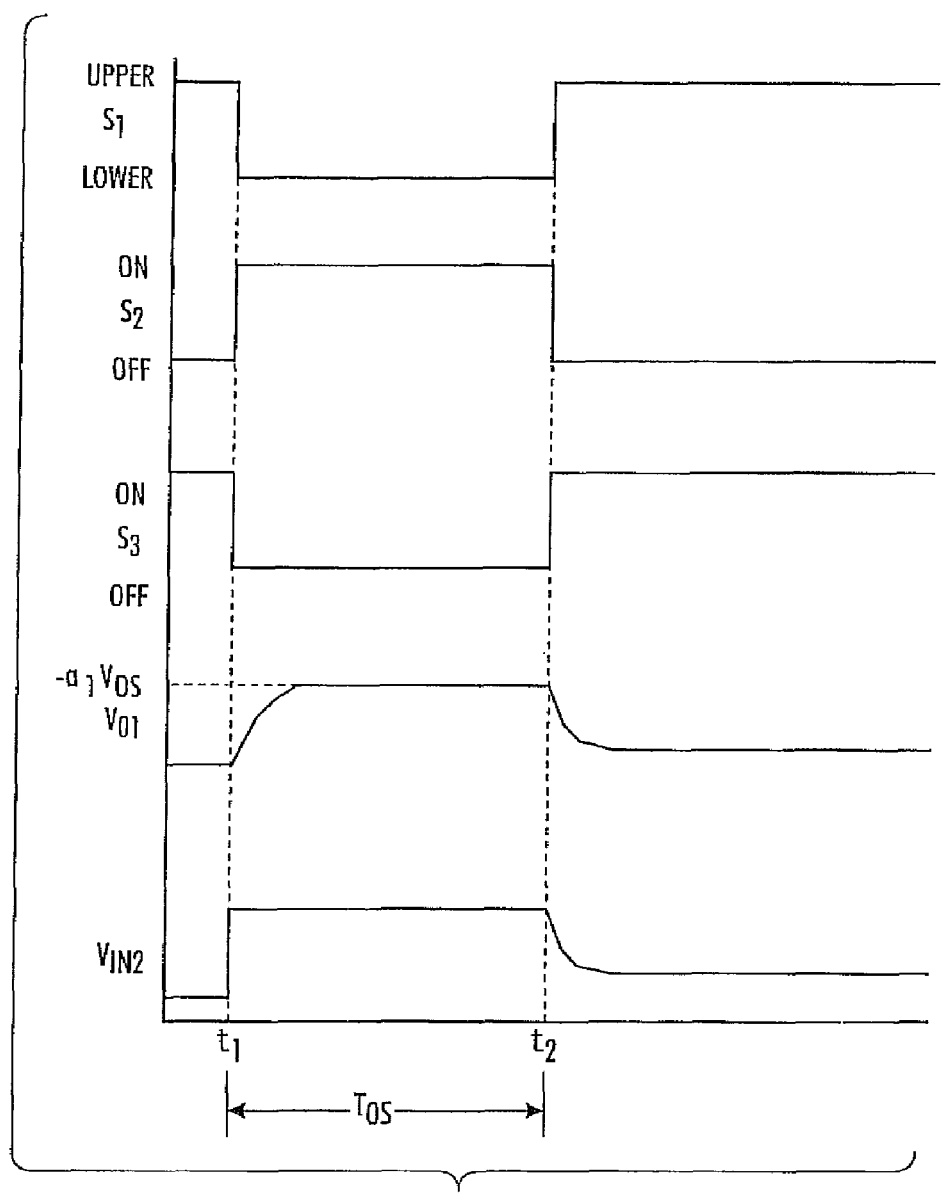
FIG. 20 illustrates a third timing diagram for the open-loop offset cancellation circuit of FIG. 19.

In another zero-crossing detector according to the second embodiment is shown to have two amplifier stages, first stage amplifier $A_1$, and the second stage amplifier $A_2$ as shown in FIG. 19. The second stage amplifier $A_2$ may be either a linear amplifier or a regenerative latch. The switch $S_3$ and the capacitor $C_{OFF2}$ perform averaging of sampled noise to lower the noise. The timing diagram is shown in FIG. 20.

During the offset cancellation phase $T_{OFF}$, the input of the first amplifier $A_1$ is connected to ground by throwing the switch $S_1$ to the upper position. The input of the second amplifier $A_2$ is also connected to ground by closing the switch $S_2$. The output voltage of the first amplifier $A_1$ settles to $-a_1 V_{OS}$. The capacitor $C_{OFF}1$ is made sufficiently small so that the output settles to an accurate value during $T_{OFF}$. At the end of $T_{OFF}$, the switch $S_2$ is then opened, whereby $-a_1 V_{OS}$ is sampled and held across the capacitor $C_{OFF}1$. During the normal operation phase following the offset cancellation phase, $S_1$ is thrown the input voltage $V_{IN}$, and $S_3$ is closed.

After a few clock cycles of operation, the voltage across $C_{OFF2}$ converges to the voltage sampled on $C_{OFF1}$, $-a_1 V_{OS}$. Since $C_{OFF2}$ is larger than $C_{OFF1}$, the sampled noise is averaged and reduced by a factor of $(1+C_{OFF2}/C_{OFF1})^{1/2}$. The effective input voltage to $A_1$ is $V_{IN}-V_{OS}$ due to the effect of the offset voltage $V_{OS}$. The output voltage of $A_1$ is then $a_1(V_{IN}-V_{OS})$. The input voltage to $A_2$ is $a_1(V_{IN}-V_{OS})-(-a_1 V_{OS}) = a_1 V_{IN}$. Thus, the effect of the offset voltage of the first amplifier $A_1$ is removed, but the sampled noise is substantially lower.

Figure 21:
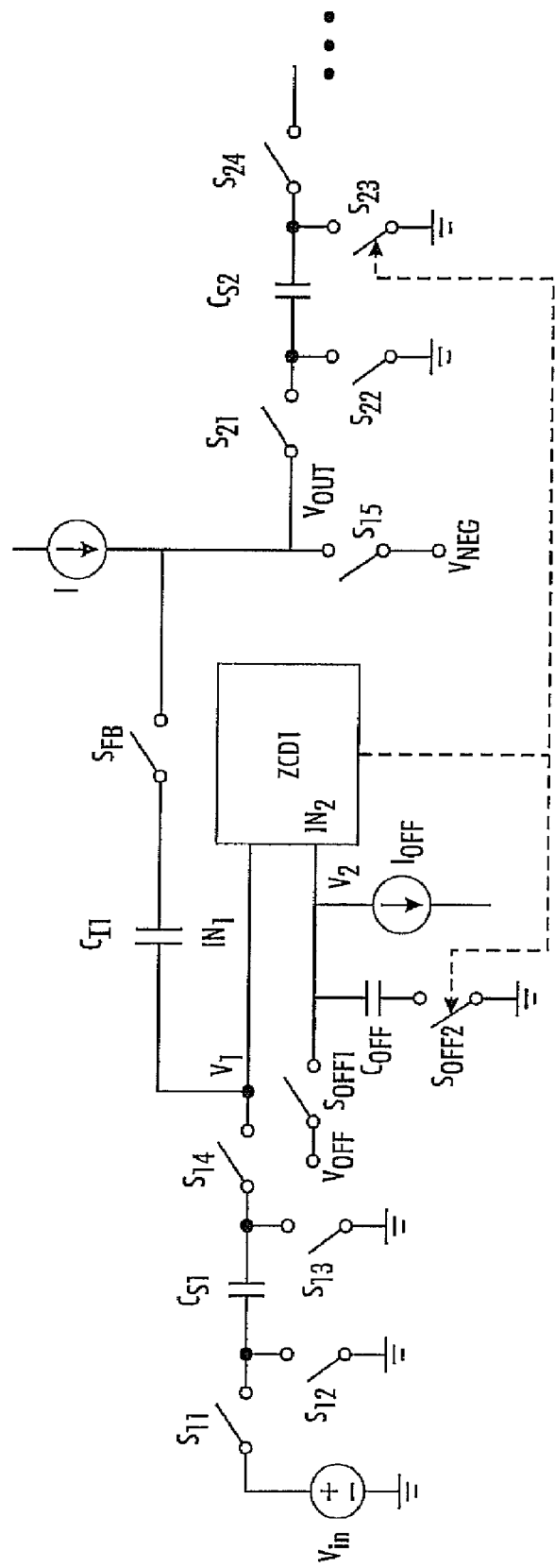
FIG. 21 illustrates a zero-crossing detector circuit with offset cancellation.

Another example of offset cancellation is illustrated in FIG. 21. For clarity, a zero-crossing detector based integrator similar to that illustrated in FIG. 4 is shown. The current source I produces ramp waveforms, functioning as a waveform generator. The current source $I_{OFF}$ and the capacitor $C_{OFF}$ sample the offset voltage of the zero-crossing detector ZCD1 to cancel its effect. During the offset cancellation phase, one input $IN_1$ is grounded by closing switches $S_{13}$ and $S_{14}$. The switch $S_{FB}$ is left open in order not to disturb the charge on the integrating capacitor $C_{I1}$. Switch $S_{OFF2}$ is closed, and switch $S_{OFF1}$ is briefly closed to precharge the capacitor $C_{OFF}$ to a voltage $V_{OFF}$. Next, switch $S_{OFF1}$ is opened, and $I_{OFF}$ is integrated on $C_{OFF}$. The value of $I_{OFF}$ is chosen in such way that the voltage at node $IN_2$ ramps down during offset cancellation at approximately the same rate as the node voltage $IN_2$ ramps up during the normal operation.

When the zero-crossing detector ZCD1 detects the crossing of the voltage $V_2$ at the input $IN_2$ of ground potential, the switch $S_{OFF2}$ is turned OFF. Shortly after, the current source $I_{OFF}$ is turned OFF, sampling the voltage on $C_{OFF}$. The voltage sampled on $C_{OFF}$ is shown to be substantially equal in magnitude and opposite in sign to the offset $V_{OS}$ of the zero-crossing detector ZCD1.

During the subsequent operation of the circuit as an integrator, switch $S_{OFF1}$ is turned OFF, and switch $S_{OFF}2$ is left ON. The voltage at the input $IN_2$ at the ZCD1 is thus maintained at $-V_{OS}$, thus, the effect of offset $V_{OS}$ in the zero-crossing detector ZCD1 is cancelled during integration operation. It is noted that a control or logic circuit (not shown) is utilized to control the operations of the various switches.

Figure 22:
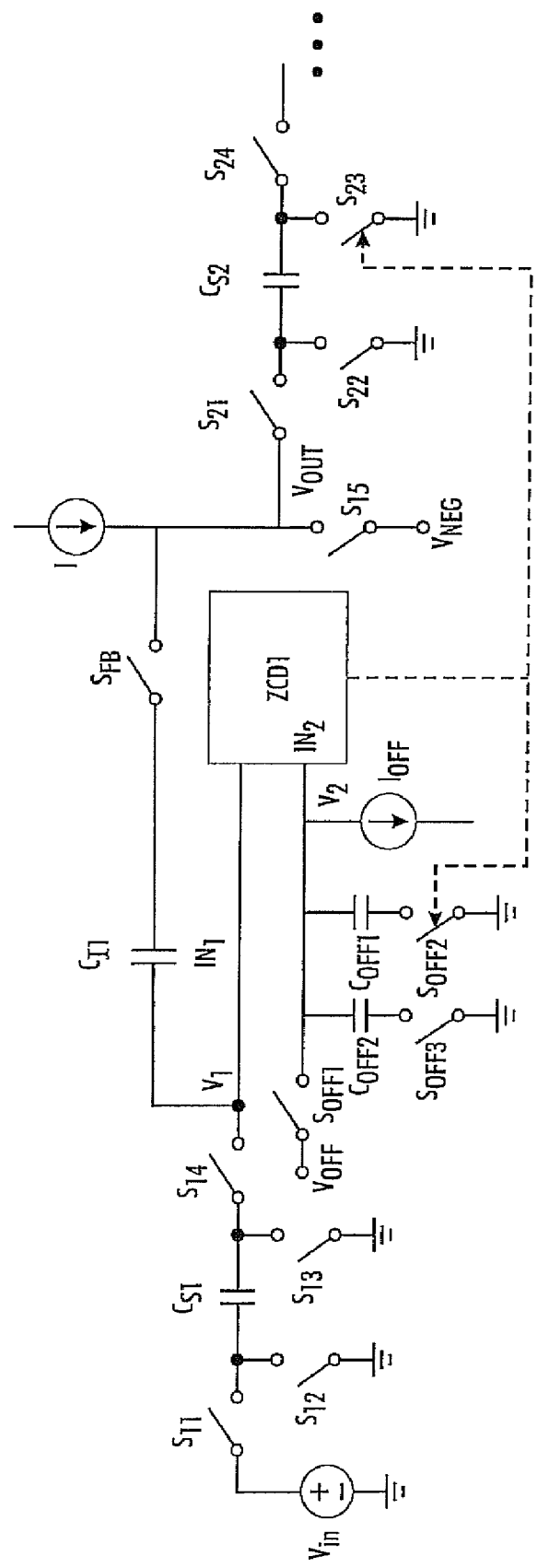
FIG. 22 illustrates another zero-crossing detector circuit with offset cancellation.

Another example of offset cancellation is illustrated in FIG. 22. This embodiment is similar to the embodiment of FIG. 21, except two capacitors, $C_{OFF1}$ and $C_{OFF2}$, store the offset voltage. Capacitor $C_{OFF2}$ is larger than capacitor $C_{OFF1}$. For clarity, a zero-crossing detector based integrator similar to that illustrated in FIG. 4 is shown.

The current source $I_{OFF}$ and the capacitor $C_{OFF1}$ sample the offset voltage of the zero-crossing detector ZCD1 to cancel its effect. The value of $I_{OFF}$ is chosen in such way that the voltage at node $IN_2$ ramps down during offset cancellation at approximately the same rate as the node voltage $IN_2$ ramps up during the normal operation.

During the offset cancellation phase, one input $IN_1$ is grounded by closing switches $S_{13}$ and $S_{14}$. The switch $S_{FB}$ is left open in order not to disturb the charge on the integrating capacitor $C_{I1}$. Switch $S_{OFF}2$ is closed, switch $S_{OFF}3$ is opened, and switch $S_{OFF1}$ is briefly closed to precharge the capacitor $C_{OFF1}$ to a voltage $V_{OFF}$. Next, switch $S_{OFF1}$ is opened, and $I_{OFF}$ is integrated on capacitor $C_{OFF}1$.

When the zero-crossing detector ZCD1 detects the crossing of the voltage $V_2$ at the input $IN_2$ at ground potential, the switch $S_{OFF2}$ is turned OFF, sampling the voltage on capacitor $C_{OFF1}$. The current source $I_{OFF}$ is then turned OFF, and switches $S_{OFF2}$ and $S_{OFF3}$ are closed causing the change in capacitors $C_{OFF1}$ and $C_{OFF2}$ to be averaged. This effectively averages sampled noise, and reduces the noise. The voltage stored on capacitors $C_{OFF1}$ and $C_{OFF2}$ is shown to be substantially equal in magnitude and opposite in sign to the offset $V_{OS}$ of the zero-crossing detector ZCD1.

During the subsequent operation of the circuit as an integrator, switch $S_{OFF1}$ is turned OFF, and switches $S_{OFF2}$ and $S_{OFF3}$ are left ON. Alternatively, switches $S_{OFF1}$ and $S_{OFF2}$ are turned OFF, and switch $S_{OFF3}$ is left ON. The voltage at the input $IN_2$ of the ZCD1 is thus maintained at $-V_{OS}$, thus, the effect of offset $V_{OS}$ in the zero-crossing detector ZCD1 is cancelled during integration operation. It is noted that a control or logic circuit (not shown) is utilized to control the operations of the various switches.

Figure 23:
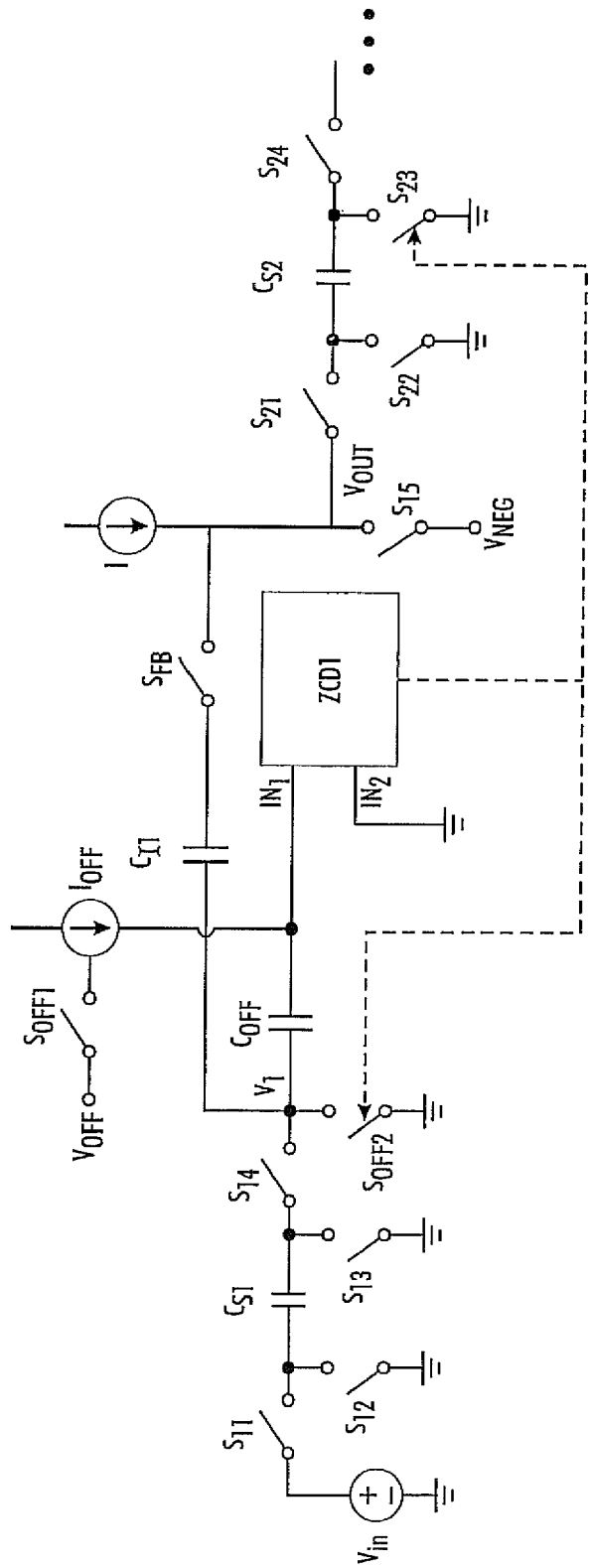
FIG. 23 illustrates a third zero-crossing detector circuit with offset cancellation.

Another example of offset cancellation is illustrated in FIG. 23. This embodiment is similar to the embodiment of FIG. 21, except the offset sampling capacitor $C_{OFF}$ is placed in series with the input $IN_1$, and the current source $I_{OFF}$ is chosen such that the ramp rate at node $IN_1$ is approximately the same during the offset cancellation and the normal operation. It is noted that a control or logic circuit (not shown) is utilized to control the operations of the various switches.

The current source $I_{OFF}$ and the capacitor $C_{OFF1}$ sample the offset voltage of the zero-crossing detector ZCD1 to cancel its effect. The value of $I_{OFF}$ is chosen in such way that the voltage at node $IN_1$ ramps down during offset cancellation at approximately the same rate as the node voltage $IN_1$ ramps up during the normal operation.

During the offset cancellation phase, a switch $S_{FB}$ is left open in order not to disturb the charge on the integrating capacitor $C_{I1}$, switch $S_{OFF2}$ is closed, and switch $S_{OFF1}$ is briefly closed to precharge the capacitor $C_{OFF}$ to a voltage $V_{OFF}$. Next, switch $S_{OFF1}$ is opened, and $I_{OFF}$ is integrated on $C_{OFF}$.

When the zero-crossing detector ZCD1 detects the crossing of the voltage $V_2$ at the input $IN_1$ of ground, the switch $S_{OFF}2$ is turned OFF. Shortly after, the current source $I_{OFF}$ is turned OFF. The voltage sampled on capacitor $C_{OFF}$ is shown to be substantially equal in magnitude and opposite in sign to the offset of the zero-crossing detector ZCD1. Therefore, the effect of offset in the zero-crossing detector ZCD1 is cancelled during subsequent operation.

Figure 24:
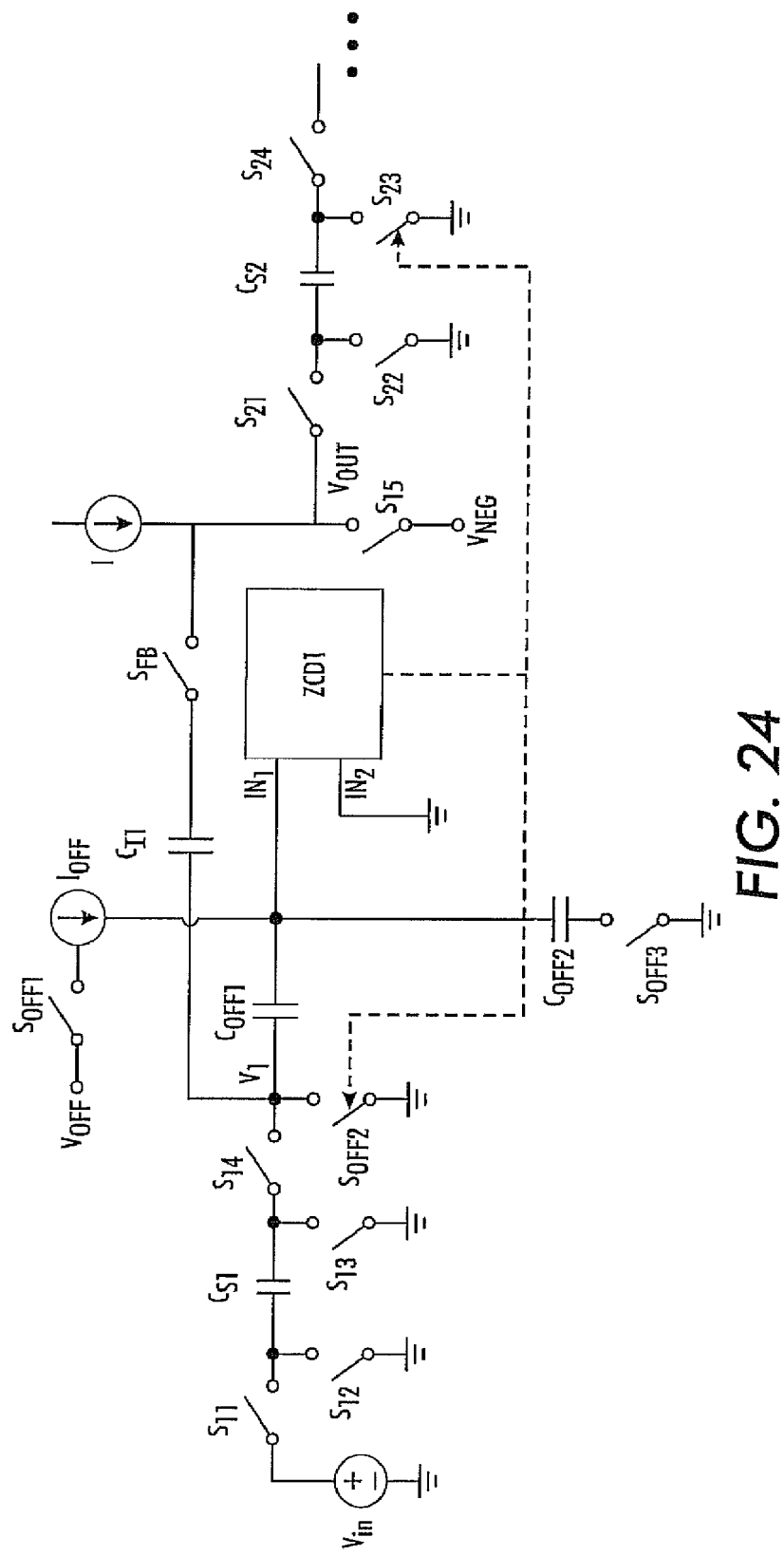
FIG. 24 illustrates a fourth zero-crossing detector circuit with offset cancellation.

Another example of offset cancellation is illustrated in FIG. 24. This embodiment is similar in operation to the embodiment of FIG. 22, except the offset is first sampled on a first offset sampling capacitor $C_{OFF1}$ and averaged with a second offset sampling capacitor $C_{OFF2}$ in a similar fashion to the embodiment illustrated in FIG. 22. The current source $I_{OFF}$ and the capacitor $C_{OFF1}$ sample the offset voltage of the zero-crossing detector ZCD1 to cancel its effect. The value of $I_{OFF}$ is chosen in such way that the voltage at node $IN_1$ ramps down during offset cancellation at approximately the same rate as the node voltage $IN_1$ ramps up during the normal operation.

During the offset cancellation phase, a switch $S_{FB}$ is left open in order not to disturb the charge on the integrating capacitor $C_{I1}$, switch $S_{OFF2}$ is closed, and switch $S_{OFF1}$ is briefly closed to precharge the capacitor $C_{OFF1}$ to a voltage $V_{OFF}$. Next, switch $S_{OFF1}$ is opened, and $I_{OFF}$ is integrated on $C_{OFF1}$.

When the zero-crossing detector ZCD1 detects the crossing of the voltage $V_2$ at the input $IN_1$ of ground, the switch $S_{OFF1}$ is turned OFF. Shortly after, the current source $I_{OFF}$ is turned OFF. The voltage sampled on capacitor $C_{OFF}1$ is shown to be substantially equal in magnitude and opposite in sign to the offset of the zero-crossing detector ZCD1. Switch $C_{OFF3}$ is then closed, connecting $C_{OFF1}$ and $C_{OFF2}$ in parallel. The charge in $C_{OFF1}$ and $C_{OFF2}$ is redistributed, averaging the sampled noise. After a few cycles of offset cancellation, the voltage stored on capacitors $C_{OFF1}$ and $C_{OFF2}$ is shown to be substantially equal in magnitude and opposite in sign to the offset $V_{OS}$ of the zero-crossing detector ZCD1. Therefore, the effect of offset in the zero-crossing detector ZCD1 is cancelled during subsequent operation.

Although the concepts of the present invention have been illustrated and described in connection with single-ended embodiments, the concepts of the present invention are also applicable to fully-differential configurations or fully-differential implementations of these single-ended embodiments.

Figure 25:
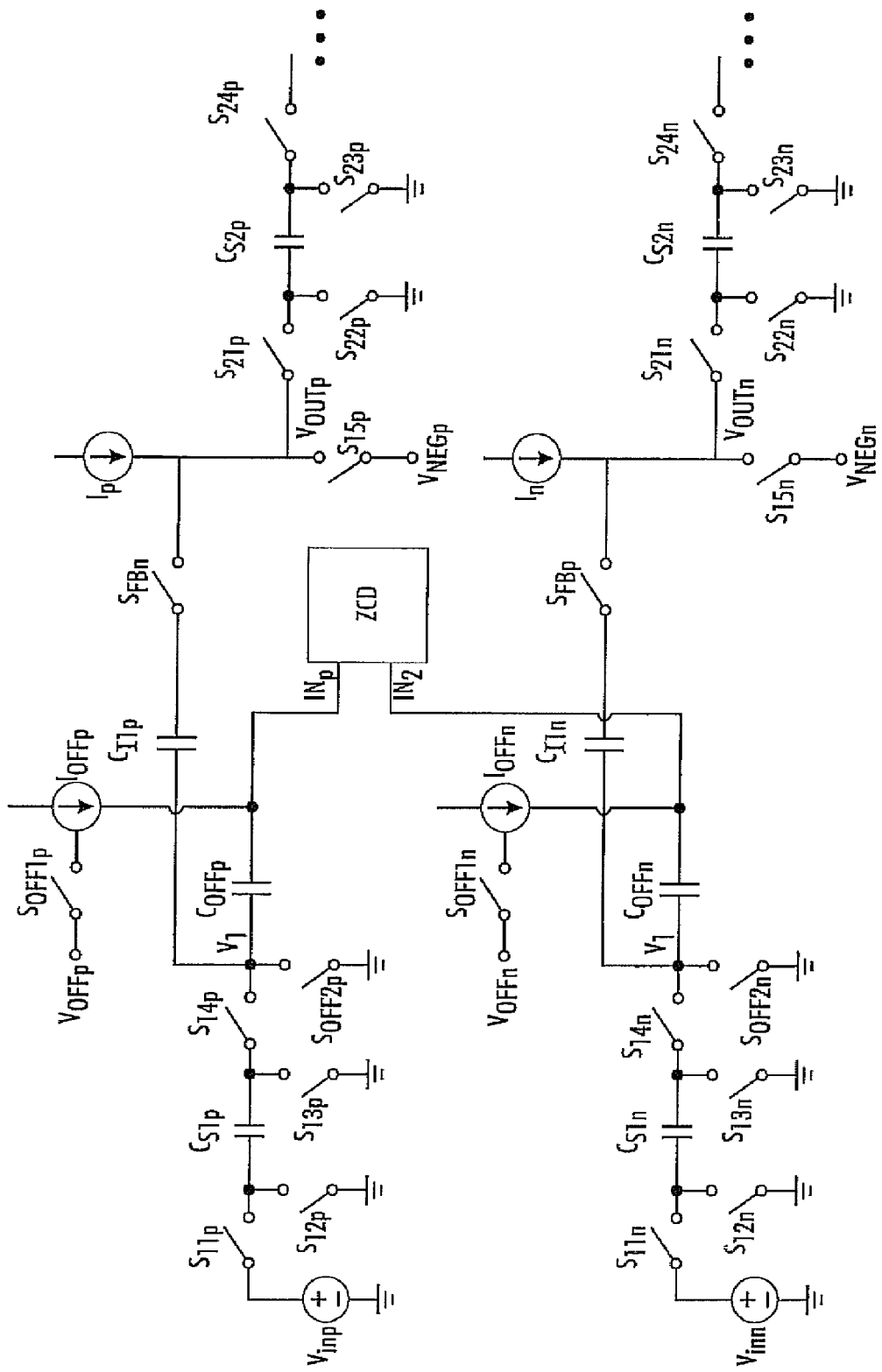
FIG. 25 illustrates a fully-differential implementation of the fourth zero-crossing detector circuit of FIG. 24.

For example, a fully-differential implementation of the embodiment illustrated in FIG. 24 is illustrated in FIG. 25.

The current sources $I_{OFFp}$, $I_{OFFn}$ and the capacitors $C_{OFF1p}$, and $C_{OFF1n}$ sample the offset voltage of the zero-crossing detector ZCD1 differentially to cancel its effect. The values of $I_{OFFp}$ and $I_{OFFn}$ are chosen in such way that the difference between voltages at node $IN_{1p}$ and $IN_{1n}$ ramps down during offset cancellation at approximately the same rate as the difference between voltages at node $IN_{1p}$ and $IN_{1n}$ ramps up during the normal operation.

During the offset cancellation phase, switches $S_{FBp}$ and $S_{FBp}$ are left open in order not to disturb the charge on the integrating capacitors $C_{I1p}$ and $C_{I1n}$, switches $S_{OFF2p}$ and $S_{OFF2p}$ are closed, and switch switches $S_{OFF1p}$ and $S_{OFF1p}$ are briefly closed to precharge the capacitors $C_{OFFp}$, and $C_{OFFn}$ to voltages $V_{OFFp}$ and $V_{OFFn}$, respectively. Next, switched $S_{OFF1}$ is opened, and $I_{OFF}$ is integrated on $C_{OFF}$.

When the zero-crossing detector ZCD1 detects the zero or level crossing of the difference between voltages $V_{2p}$ and $V_{2n}$ at the input $IN_{1p}$ and $IN_{1n}$, respectively, the switches $S_{OFF2p}$ and $S_{OFF2p}$ are turned OFF. Shortly after, the current sources $I_{OFFp}$ and $I_{OFFn}$ are is turned OFF. The difference between voltages sampled on capacitor $C_{OFFp}$ and $C_{OFFn}$ is shown to be substantially equal in magnitude and opposite in sign to the offset of the zero-crossing detector ZCD1. Therefore, the effect of offset in the zero-crossing detector ZCD1 is cancelled during subsequent operation.

Although the concepts of the present invention have been illustrated and described in connection with zero-crossing detector based circuits, the concepts of the present invention are also applicable to comparator based circuits.

While various examples and embodiments of the present invention have been shown and described, it will be appreci-

What is claimed is:

1. A comparator based circuit with effective offset cancellation, comprising:
   a comparator to compare an input voltage with another voltage;
   a switched-capacitor network operatively connected to said comparator;
   an offset capacitor operatively connected to an input of said comparator;
   a preset voltage source, operatively connected to said offset capacitor, to charge said offset capacitor to a predetermined voltage;
   a waveform generator circuit, operatively connected to said offset capacitor, to apply a predetermined voltage waveform on said offset capacitor; and
   a sampling switch operatively connected to said offset capacitor; said sampling switch turning OFF when said comparator determines that a voltage at said input of said comparator crosses a predetermined level.

2. The comparator based circuit as claimed in claim 1, wherein said waveform generator circuit includes a current source and a switch.

3. The comparator based circuit as claimed in claim 1, wherein said predetermined voltage waveform is a ramp.

4. The comparator based circuit as claimed in claim 1, further including a noise averaging circuit operatively connected to said first offset capacitor.

5. The comparator based circuit as claimed in claim 4, wherein said noise averaging circuit includes a second offset capacitor.

6. A zero-crossing detector based circuit with effective offset cancellation, comprising:
   a zero-crossing detector with a first input and a second input;
   a switched-capacitor network operatively connected to said zero-crossing detector;
   an offset capacitor operatively connected to said first input of said zero-crossing detector;
   a preset voltage source, operatively connected to said offset capacitor, to charge said offset capacitor to a predetermined voltage;
   a waveform generator circuit, operatively connected to said offset capacitor, to apply a predetermined voltage waveform on said offset capacitor; and
   a sampling switch operatively connected to said offset capacitor; said sampling switch turning OFF when said zero-crossing detector determines that a voltage at said first input crosses a ground potential.

7. The zero-crossing based circuit as claimed in claim 6, wherein said waveform generator circuit includes a current source and a switch.

8. The zero-crossing based circuit as claimed in claim 6, wherein said predetermined voltage waveform is a ramp.

9. The zero-crossing detector based circuit as claimed in claim 8, wherein said ramp has a rate to enable a voltage at said second input of said zero-crossing detector to ramp down during offset cancellation at approximately a same rate as a voltage at said second input of said zero-crossing detector ramps up during a normal operation.

10. The zero-crossing detector based circuit as claimed in claim 6, wherein a voltage on said offset capacitor, after said sampling switch turns OFF, being substantially equal in magnitude to an offset voltage of said zero-crossing detector.

11. The zero-crossing based circuit as claimed in claim 6, further including a noise averaging circuit operatively connected to said first offset capacitor;

12. The zero-crossing based circuit as claimed in claim 11, wherein said noise averaging circuit includes a second offset capacitor;

13. A level-crossing detector based circuit with effective offset cancellation, comprising:
   a level-crossing detector with a first input and a second input;
   a switched-capacitor network operatively connected to said level-crossing detector;
   an offset capacitor operatively connected to said first input of said level-crossing detector;
   a preset voltage source, operatively connected to said offset capacitor, to charge said offset capacitor to a predetermined voltage;
   a waveform generator circuit, operatively connected to said offset capacitor, to apply a predetermined voltage waveform on said offset capacitor; and
   a sampling switch operatively connected to said offset capacitor; said sampling switch turning OFF when said level-crossing detector determines that a voltage at said first input crosses a predetermined level.

14. The level-crossing based circuit as claimed in claim 13, wherein said waveform generator circuit includes a current source and a switch.

15. The level-crossing based circuit as claimed in claim 13, wherein said predetermined voltage waveform is a ramp.

16. The level-crossing detector based circuit as claimed in claim 15, wherein said ramp has a rate to enable a voltage at said second input of said level-crossing detector to ramp down during offset cancellation at approximately a same rate as a voltage at said second input of said level-crossing detector ramps up during a normal operation.

17. The level-crossing detector based circuit as claimed in claim 13, wherein a voltage on said offset capacitor, after said sampling switch turns OFF, being substantially equal in magnitude to an offset voltage of said level-crossing detector.

18. The level-crossing based circuit as claimed in claim 13, further including a noise averaging circuit operatively connected to said first offset capacitor.

19. The level-crossing based circuit as claimed in claim 18, wherein said noise averaging circuit includes a second offset capacitor;

20. A method of effectively canceling offset in a zero-crossing detector based circuit, comprising:
   (a) charging an offset capacitor to a predetermined voltage;
   (b) applying a predetermined voltage waveform on the offset capacitor;
   (c) determining when a voltage at an input of a zero-crossing detector has crossed a predetermined level;
   (d) holding the voltage on the offset capacitor when it is determined that the voltage at the input of the zero-crossing detector has crossed the predetermined level; and
   (e) canceling an offset of the zero-crossing detector using the voltage held on the offset capacitor when it is determined that the voltage at the input of the zero-crossing detector has crossed the predetermined level.

21. A method of effectively canceling offset in a level-crossing detector based circuit, comprising:
   (a) charging an offset capacitor to a predetermined voltage;
   (b) applying a predetermined voltage waveform on the offset capacitor;
   (c) determining when a voltage at an input of a level-crossing detector has crossed a predetermined level;

(d) holding the voltage on the offset capacitor when it is determined that the voltage at the input of the level-crossing detector has crossed the predetermined level; and (e) canceling an offset of the level-crossing detector using the voltage held on the offset capacitor.

22. A method of effectively canceling offset in a comparator based circuit, comprising:

(a) charging an offset capacitor to a predetermined voltage;

(b) applying a predetermined voltage waveform on the offset capacitor;

(c) determining when a voltage at an input of a comparator has crossed a predetermined level;

(d) holding the voltage on the offset capacitor when it is determined that the voltage at the input of the comparator has crossed the predetermined level; and (e) canceling an offset of the comparator using the voltage held on the offset capacitor.

* * * * *